(12) United States Patent
Davis et al.

(10) Patent No.: US 11,454,659 B2
(45) Date of Patent: Sep. 27, 2022

(54) MULTI-PURPOSE (MULTI-DWELLING) ELECTRIC METERING SYSTEM AND METHOD

(71) Applicant: Pacific Gas and Electric Company, San Francisco, CA (US)

(72) Inventors: Earle S. Davis, Walnut Creek, CA (US); Quoc Hoang, Walnut Creek, CA (US); Alan S. Jones, Berkeley, CA (US); Duong M. Nguyen, Alameda, CA (US); Tri Q. Nguyen, Milpitas, CA (US); Edmond A. Padrones, Benicia, CA (US); Shelley R. Williams, Antioch, CA (US); Alex P. Yan, Berkeley, CA (US)

(73) Assignee: PACIFIC GAS AND ELECTRIC COMPANY, San Francisco, CA (US)

( * ) Notice: Subject to any disclaimer, the term of this patent is extended or adjusted under 35 U.S.C. 154(b) by 246 days.

(21) Appl. No.: 16/248,519

(22) Filed: Jan. 15, 2019

(65) Prior Publication Data

US 2019/0219618 A1    Jul. 18, 2019

Related U.S. Application Data

(60) Provisional application No. 62/617,949, filed on Jan. 16, 2018.

(51) Int. Cl.
*G01R 22/06* (2006.01)
*B60S 5/00* (2006.01)
(Continued)

(52) U.S. Cl.
CPC ............ *G01R 22/065* (2013.01); *B60L 53/63* (2019.02); *B60L 53/665* (2019.02); *B60S 5/00* (2013.01);
(Continued)

(58) Field of Classification Search
CPC .. G01R 22/063; G01R 22/065; G01R 22/066; G01D 4/00; G01D 4/002; G01D 4/004; G01D 4/008; B60L 53/63; B60L 53/665
See application file for complete search history.

(56) References Cited

U.S. PATENT DOCUMENTS 7,285,947 B2 * 10/2007 Domingo ............... G01R 21/07
324/142
2007/0001868 A1    1/2007 Boaz
(Continued)

FOREIGN PATENT DOCUMENTS

EP            1764618 A2    3/2007

*Primary Examiner* — Alvaro E Fortich
(74) *Attorney, Agent, or Firm* — Greenberg Traurig LLP

(57) ABSTRACT

Some embodiments include a metering system including a base housing configured to be coupled to a supply of a consumable, and including a plurality of meter slots, wherein each meter slot is configured to couple with a removeable meter module. Further, the metering system includes a removeable cover housing configured to removably couple to the base housing, and a meter module that includes at least one meter core and at least one data transfer functionality or assembly. The meter module can independently meter at least a portion of the consumable consumed by at least one consumer. A metering assembly with a removeable meter module and an associated meter slot can independently meter at least a portion of a consumable consumed by at least one consumer, and metering of the consumable to a consumer from one meter slot is independent of metering of the consumable from another meter slot.

17 Claims, 15 Drawing Sheets

(51) Int. Cl.
*B60L 53/66* (2019.01)
*B60L 53/63* (2019.01)

(52) U.S. Cl.
CPC ........ *G01R 22/063* (2013.01); *B60L 2250/16* (2013.01)

(56) References Cited

U.S. PATENT DOCUMENTS

| | | |
|---|---|---|
| 2008/0238711 A1 | 10/2008 | Payne et al. |
| 2010/0057387 A1 | 3/2010 | Kagan et al. |
| 2011/0264295 A1* | 10/2011 | Schmelcher ........... G01D 4/002 700/295 |
| 2013/0204450 A1* | 8/2013 | Kagan ................... G01D 4/004 700/291 |
| 2013/0226485 A1* | 8/2013 | Pietrowicz .......... H04L 63/1416 702/62 |
| 2016/0285872 A1* | 9/2016 | Polar ...................... G06Q 50/06 |
| 2016/0356831 A1* | 12/2016 | Vezina ................. H05K 5/0004 |
| 2017/0140482 A1* | 5/2017 | Salter ................ G06Q 30/0283 |
| 2017/0215295 A1* | 7/2017 | Herzig ................... H02J 3/381 |

* cited by examiner

MULTI-PURPOSE (MULTI-DWELLING) ELECTRIC METERING SYSTEM AND METHOD

RELATED APPLICATIONS

This application claims priority to U.S. provisional application Ser. No. 62/617,949, filed on Jan. 16, 2018, the entire contents of which are incorporated herein by reference.

BACKGROUND

Current metering solutions generally require one meter per customer's equipment. The metering industry uses one full meter per dwelling, and does not currently utilize multi-purpose meter (MPM) or multi-dwelling unit (MDU) meter technology. In situations where there are multiple pieces of equipment on the same streetlight pole, or multiple dwellings in the same building, multiple meters are required. Commercial and larger residential buildings typically have a meter room where there are many meters mounted on walls in rows and/or columns.

MPM or MDU meter technologies can reduce the total number of meters installed in new buildings, or when retrofitted into older buildings, and can eliminate the need for traditional meter panels. Further, the combination of a power box and MPM or MDU can reduce the installed foot-print, thereby necessitating less space inside the building. In most installations, the use of MPM or MDU meter technology could reduce operational and asset costs with reduced metering equipment. Additionally, this type of meter could provide the ability to serve multiple service points with multiple ownerships at that same premise, such as a building, a pole, EV charging station, etc. In most circumstances, a multi-purpose meter could replace many meters, and some customer-owned sockets could utilize low cost individual meters ("IDV" meters). This could reduce the number of components inside electric meters, reduce material costs, and lower overall meter installation and maintenance costs.

Various technologies are being developed that will demand a growing number of small-load applications on electric streetlight poles and electric vehicle charging stations. For example, a streetlight pole may have one or more LED streetlights, one or more safety cameras, one or more EV charging points, at least one Wi-Fi hub, telecommunication cell site equipment, one or more solar panels, and/or one or more traffic signal, etc., each of which may have a different owner where energy usage needs to be billed separately. A multi-purpose meter could provide a simplified metering solution without the need to mount a metering panel on the streetlight pole. Thus, this solution has the potential to significantly reduce the meter installation and maintenance costs.

SUMMARY

Some embodiments include a metering system comprising a base housing configured to be coupled to a supply of a consumable, and including a plurality of meter slots, where each meter slot is configured to couple with a removeable meter module. Further, some embodiments include a removeable cover housing configured to removably couple to the base housing. Some further embodiments include a meter module including at least one meter core and at least one data transfer functionality or assembly. In some embodiments, the meter module is configured to independently meter at least a portion of the consumable consumed by at least one consumer.

Some embodiments of the invention further comprise at least one other meter module configured and arranged to independently meter at least a portion of the consumable consumed by at least one consumer and/or at least one other consumer. In some further embodiments, the meter module includes at least a portion of a data management system configured and arranged to communicate one or more parameters or data through the at least one data transfer functionality or assembly. In some embodiments, the data management system includes or is configured to be coupled to a consumer's mobile device or computer to view at least one parameter related to at least one of consumption of the consumable, a meter module operation function in real-time, and a physical location of the meter module. In some other embodiments, the data management system is configured to process and exchange data comprising at least one of consumable usage, meter module operation function in real-time, and/or physical location of the meter module.

In some embodiments, the meter module is a mobile meter module. In some further embodiments, the base housing is configured for mounting to a fixed structure in a building. In other embodiments, the removeable cover housing includes at least one of at least one indicator, button, actuator, and interface.

Some embodiments of the invention include at least one data transfer functionality that comprises at least one of an input/output front end backbone and an RF module. In some embodiments, a wireless capability of the RF module includes cellular 5G, 4G/LTE, and/or Wi-Fi, and/or WiMAX, and/or Wi-Sun, and/or 400 MHz and/or 900 MHz frequency transceiver capability, GPS 121, RFID, and Bluetooth®.

In some embodiments, at least one data transfer functionality comprises a GPS transceiver, a local device access, a data meter input/output front end, power meter sensors, home device control, and/or RFID module.

Some further embodiments include at least one meter management unit configured to couple to and serve at least one meter module. Some embodiments include at least one meter management unit is configured to provide, control and/or monitor a consumable to users through a communications bus. Further, some embodiments include an antenna or module coupled to one or more transceivers of the at least one meter management unit that can be configured to transmit data related to the consumable consumed by the at least one consumer, and/or transmit data related to a parameter or function of the at least one meter management unit or the at least one meter module.

Some embodiments include a metering assembly comprising a base configured to be coupled to a supply of a consumable, where the base includes a plurality of meter slots. In some embodiments, each meter slot of the plurality of meter slots is configured to interface or couple with a removeable meter module that includes at least one meter core and at least one data transfer functionality. In some embodiments, the removeable meter module and an associated meter slot is configured to independently meter at least a portion of the consumable consumed by at least one consumer, where metering of the consumable to a consumer from one meter slot is independent of metering of the consumable from at least one other meter slot.

Some embodiments further comprise one or more indicators positioned in the base, where the one or more of the indicator lights are configured to indicate a function, activity or status of one or more removeable meter modules coupled to the base. Some other embodiments further comprise a removeable cover housing configured to reversibly couple to the base.

In some embodiments, the removeable cover housing includes at least one indicator, button, actuator, and/or interface. In some further embodiments, the base comprises a voltage capability that includes a motherboard configured to support at least one consumer with a voltage that is less than a voltage of the voltage capability. In some embodiments, the base is configured to provide the voltage that is less than the voltage of voltage capability using a removeable or replaceable module. Some other embodiments further comprise a CT and/or disconnect switch integral to, and/or coupled to a motherboard.

DETAILED DESCRIPTION

Figure 1:
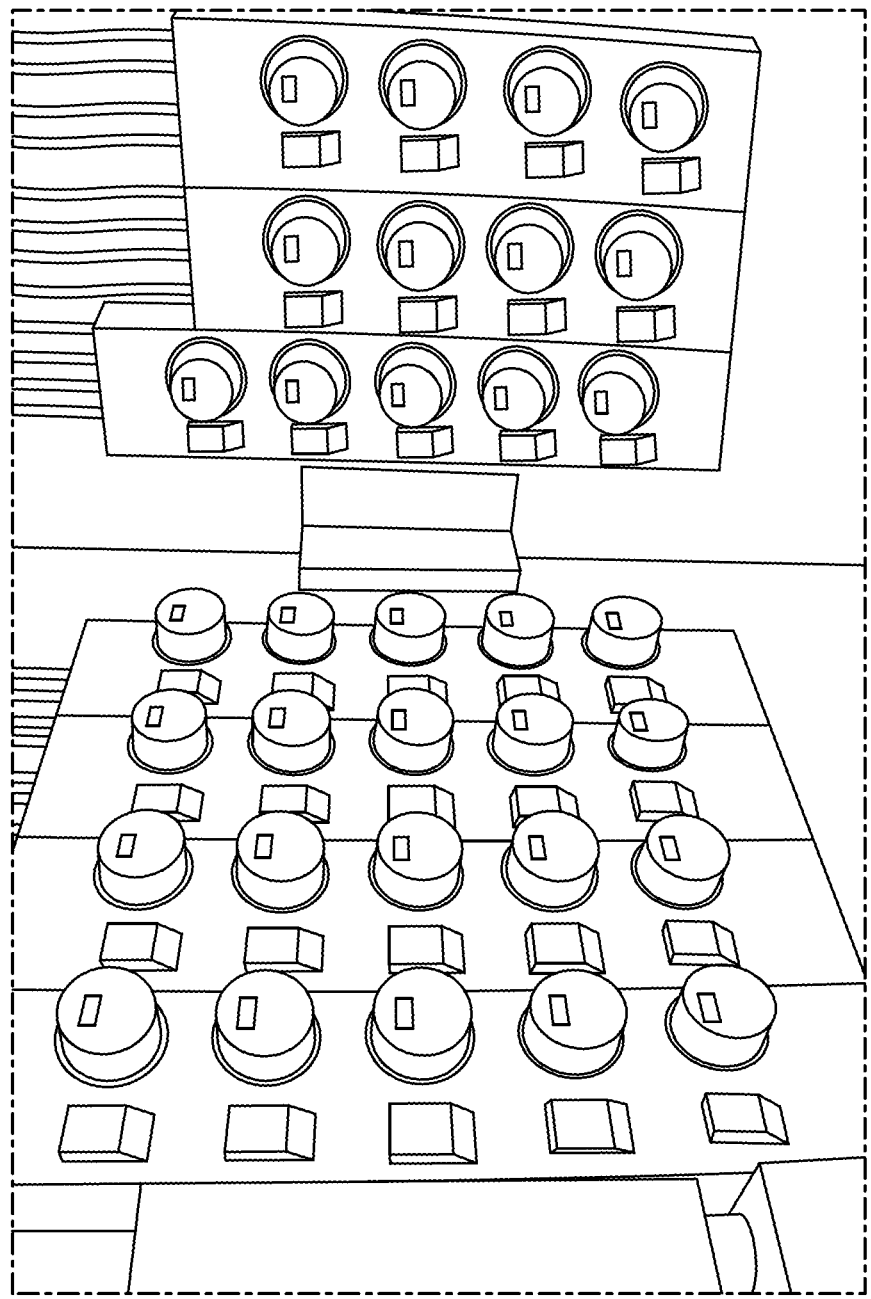
FIG. 1 is a perspective view of a conventional meter room.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Some embodiments include a meter that can measure energy consumption in locations where multiple meters measure energy of multi-dwellings and/or situations such as apartment buildings, office buildings, multi-tenant smart poles, thereby reducing the need for multiple single-use meters in any given location. In some embodiments, the meter can be a credit card sized assembly for increased and convenient mobility.

In some embodiments, a meter or metering system can comprise any one or more of the resource meters or assemblies described herein, including, but not limited to gas meters, electric meters, and hybrid combinations of gas and electric meters. As used herein, a meter can include any of the functions described herein, and can be applied to gas metering, electric metering, or a combination of gas and electric metering. Other applications include water and other resource metering.

FIG. 1 is a perspective view of a conventional meter room, and is shown as an example of a commercial and/or larger residential building where many meters are stacked in rows and columns extending across two walls. This conventional technology utilizes a single meter for every tenant, resident, or consumer. Embodiments of the invention as disclosed below can replace and/or supplement the meters of FIG. 1 where one meter can serve more than one tenant, resident, or consumer. For the purposes of brevity, the term "consumer" will be used throughout to describe a user of energy being metered, where the user can be a person or persons, a company, or any other entity utilizing energy being measured and/or fed through the meter.

Figure 2:
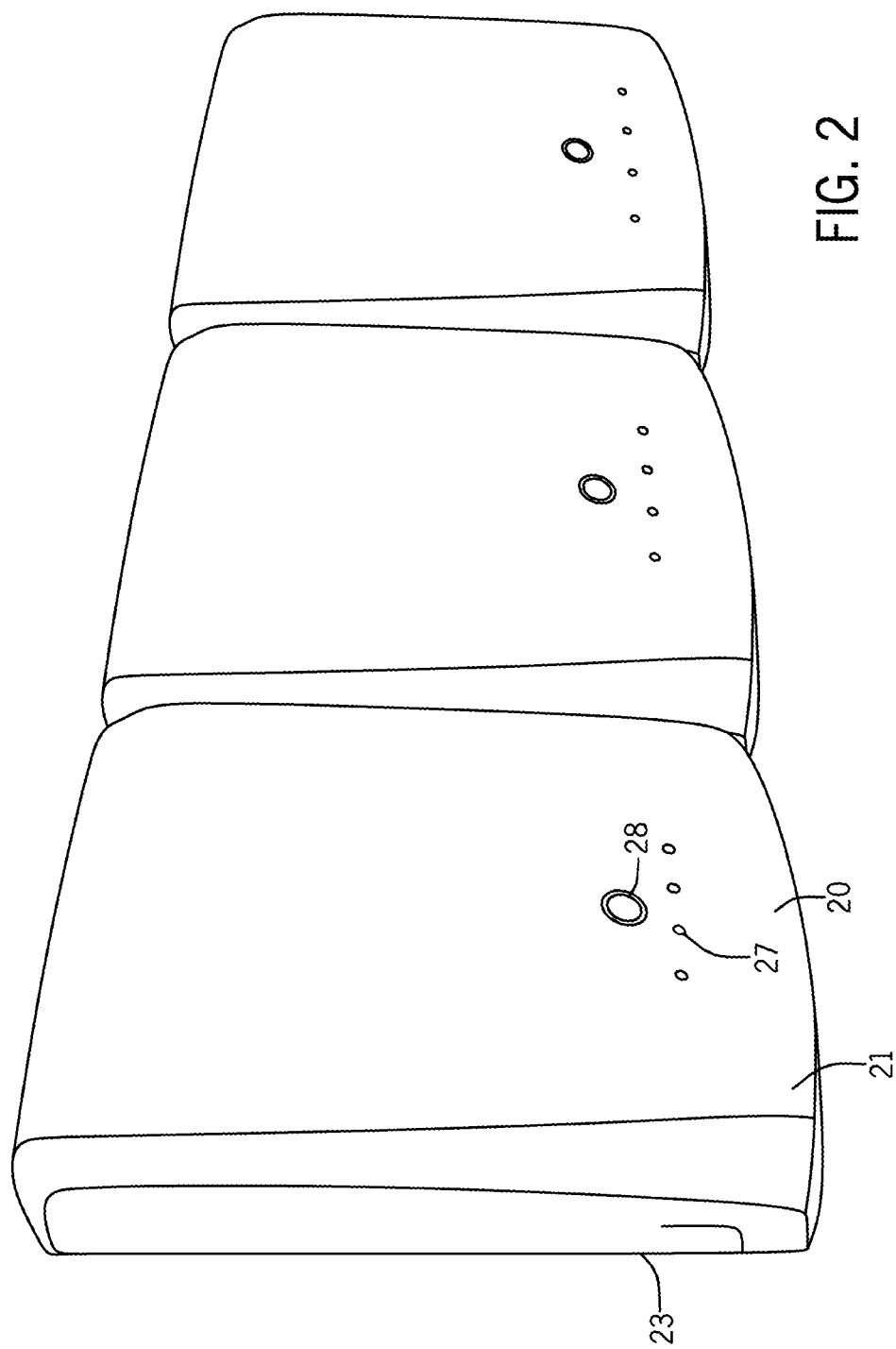
FIG. 2 is perspective view of a meter room in accordance with some embodiments of the invention.

FIG. 2 is perspective view of a meter room in accordance with some embodiments of the invention. In some embodiments, the meter room can include one or more cabinets 20 that can house one or more meters serving a plurality of consumers or spaces. In some embodiments, the meter room can include at least one high voltage meter service cabinet, and at least one low voltage meter service cabinet (cabinets 20 can house at least one low voltage meter, and/or at least one high voltage meter, or hybrid meters capable of metering electricity and gas or another consumable). In some embodiments, the cabinets 20 can be substantially identically sized and shaped. In the non-limiting embodiments of FIG. 2, the cabinets 20 can comprise a generally rectangular box. In some other embodiments, the cabinets 20 can be sized and shaped differently. In some further embodiments, the cabinets 20 can include a generally circular or curved housing portion. In other embodiments, the cabinets can include a square portion.

In some embodiments, the cabinets 20 can include a high voltage meter service cabinet and a plurality of low voltage meter service cabinets. In some other embodiments, at least one of the low voltage meter service cabinets of the cabinets 20 can be coupled to the high voltage meter service cabinet of the cabinets 20. In some further embodiments, the cabinets 20 or the high voltage meter service cabinets and/or the low voltage meter service cabinets of the cabinets 20 can include one or more indicators, buttons or actuators, and/or interfaces positioned on an outer face of the cabinet. In some embodiments, any status, function, activity alert and/or malfunction can be displayed on the one or more indicators and/or interfaces. For example, some embodiments include a display and/or indicator light 27 that can be positioned on and/or through the removeable cover 21 which is coupled to the base 23. Further, some embodiments include one or more indicators, buttons, actuators, and/or interfaces 28 positioned on and/or through the cover 21. In some embodiments, some portion or all a housing of the cabinets 20 (removeable cover 21 coupled to base 23) can comprise a non-transparent material. In other embodiments, some portion or the entirety of the housing of the cabinets 20 can comprise a transparent or partially transparent material. In some embodiments, one or more meters of the cabinets 20 can be at least partially viewable through the housing of one or more of the cabinets 20.

Figure 3:
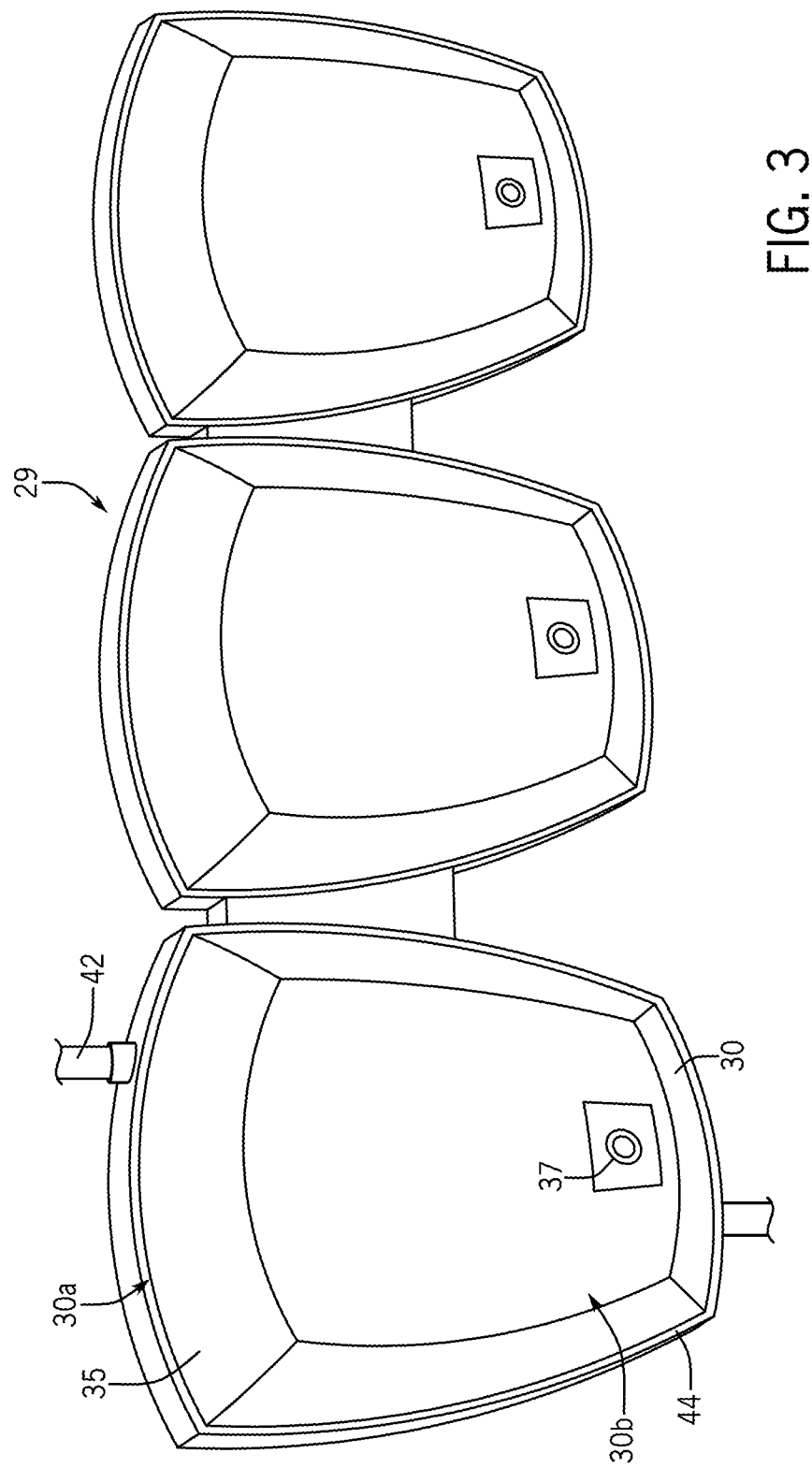
FIG. 3 is perspective view of a meter room including a plurality of meters or meter cabinets in accordance with some further embodiments of the invention.

FIG. 3 is perspective view of a meter room including a plurality of meters or meter cabinets 29 in accordance with some further embodiments of the invention. In the non-limiting embodiment of FIG. 3, the cabinets 30 of the meter room can comprise a curved box including a tapered profile including a base or base housing 44 with a coupled removeable cover 35. In some embodiments, one end of the cabinets 30 (e.g., such as an upper end 30*a*) can comprise a width that is larger than the lower end of the cabinet (i.e., such as lower end 30*b*, where the upper end 30*a* is an end that is positioned on a surface higher than the lower end 30*b*). In some embodiments, at least one of the cabinets 30 shown can be a high voltage meter service cabinet, and/or at least one of the cabinets can be a low voltage meter service cabinet. In some embodiments, cabinets 30 can include one or more indicators, buttons, and/or interfaces positioned on an outer face of the cabinet. In some embodiments, any status, function, activity alert and/or malfunction can be displayed on the one or more indicators and/or interfaces. For example, in some embodiments, a display and/or indicator light 37 can be positioned on and/or through the removeable cover 35. In some embodiments, some portion or all the housing of the cabinets 30 can comprise a non-transparent material. In other embodiments, some portion or the entirety of the housing of the cabinets 30 can comprise a transparent or partially transparent material (as depicted in FIG. 3). In some embodiments, one or more meters of the cabinets 30 can be at least partially viewable through the housing of one or more of the cabinets 30.

Figure 4:
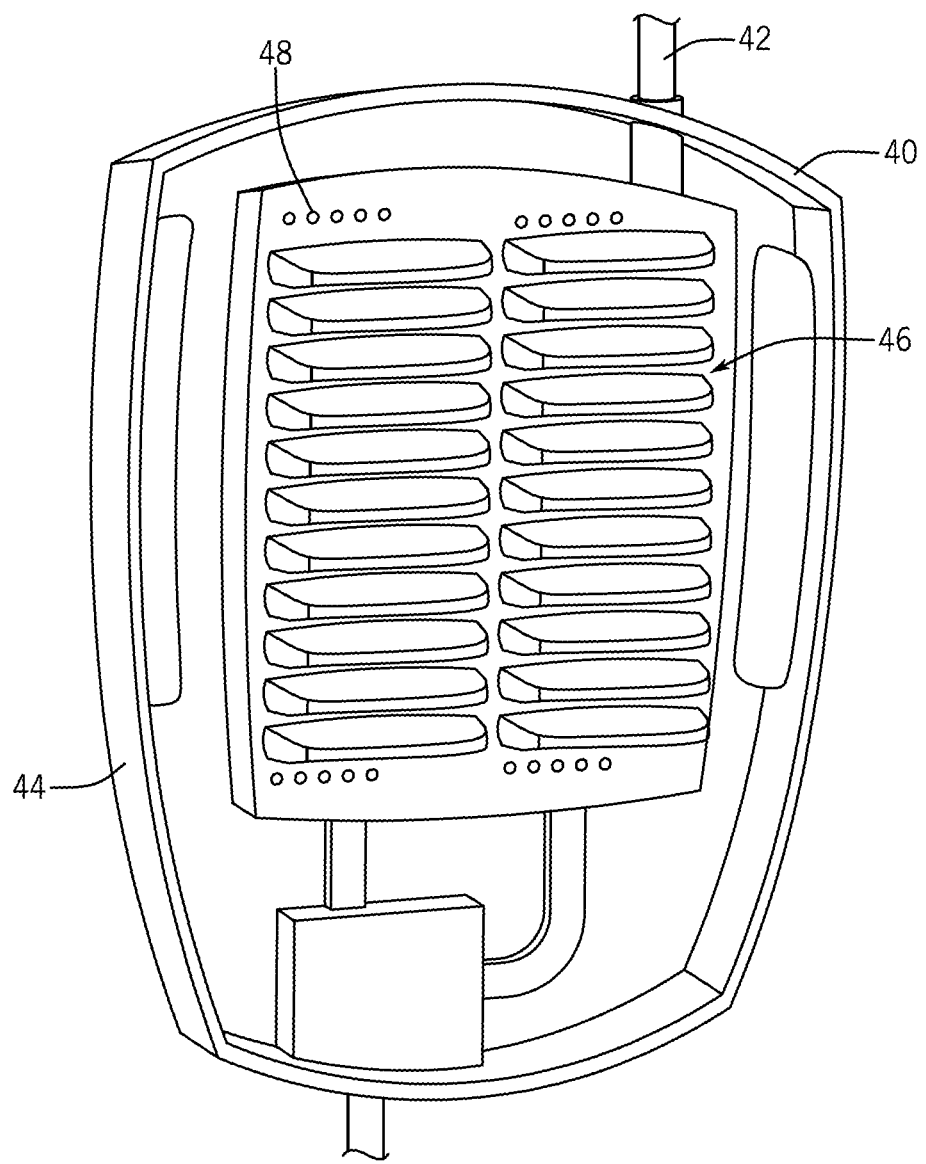
FIG. 4 is perspective view of a meter system with a front cover removed or absent in accordance with some further embodiments of the invention.

FIG. 4 is perspective view of a meter system 40 with removeable cover 35 removed or absent in accordance with some further embodiments of the invention. In some embodiments, the meter system 40 can include a plurality of meter modules 46 positioned in a base housing 44. As illustrated, in some embodiments, the meter system 40 can include a plurality of indicator lights 48 positioned within the base housing 44 of the meter system 40 (e.g., where in some embodiments, each of the modules 46 is associated with an indicator light 48). In some embodiments, one or more of the indicator lights 48 can indicate a function, activity or status of one or more of the meter modules 46. In some embodiments, the indicator lights 48 are only visible in the base housing 44 with removeable cover 35 removed as shown. In other embodiments, the indicator lights 48 can be viewable through the base housing 44 (or the removeable cover 35). In some embodiments, the meter system 40 can include a high voltage supply line 42 extending into the housing of the meter system 40. In some embodiments, the high voltage supply line 42 can be fed to one or more columns or banks of meter modules 46.

Figure 5:
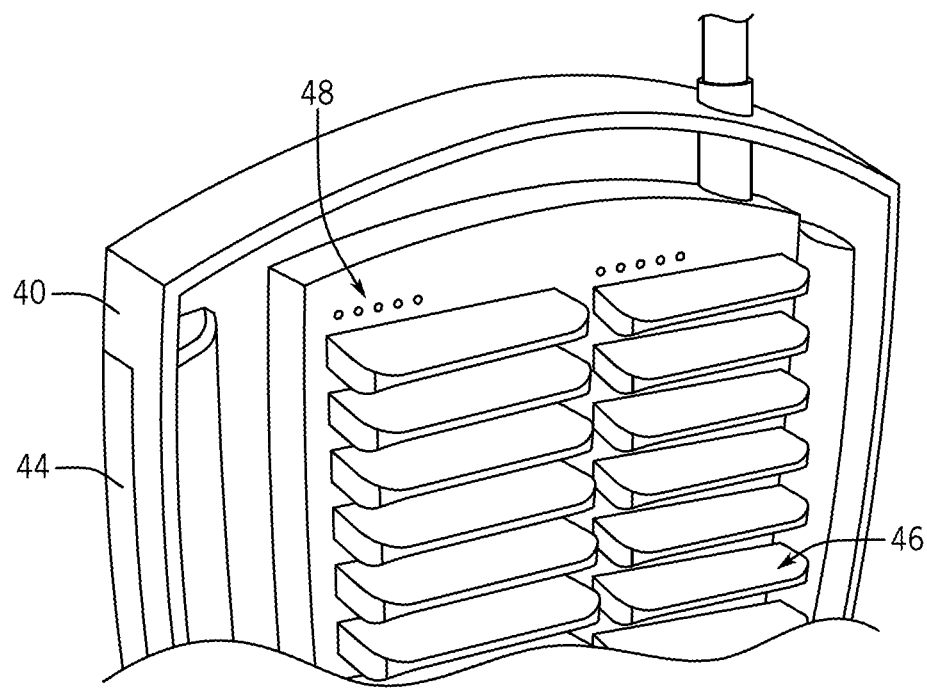
FIG. 5 is a close-up perspective view of a meter system in accordance with some further embodiments of the invention.
Figure 6:
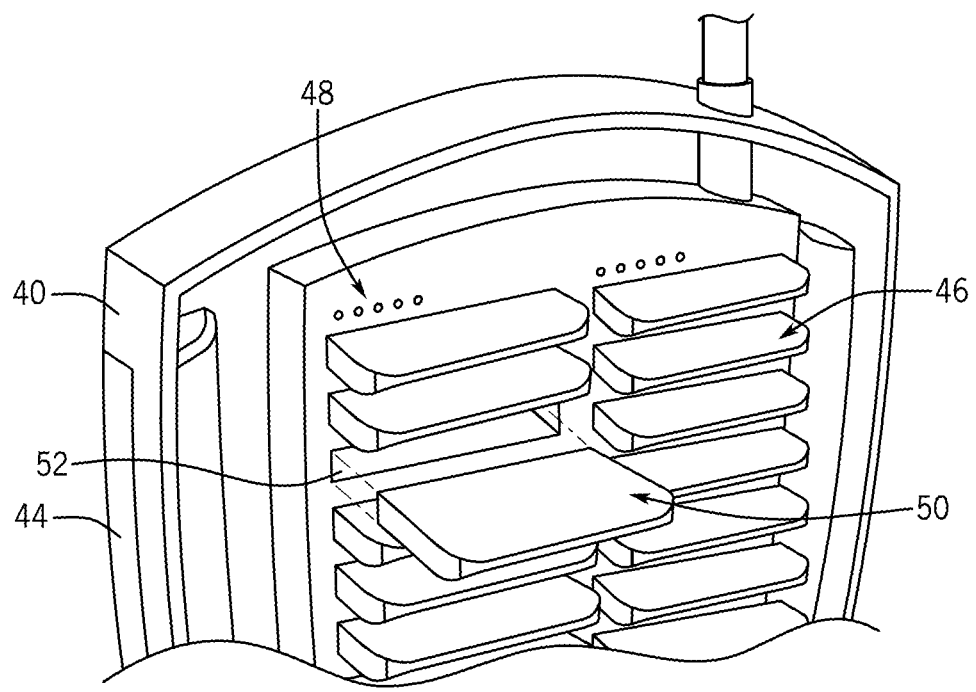
FIG. 6 is a close-up perspective assembly view of meter modules of the meter system of FIG. 5 in accordance with some further embodiments of the invention.

FIG. 5 is a close-up perspective view of the meter system 40 in accordance with some further embodiments of the invention, and FIG. 6 is a close-up perspective assembly view of meter modules of the meter system of FIG. 5 in accordance with some further embodiments of the invention. For example, as shown, the meter system 40 can include a plurality of meter modules 46. In this non-limiting embodiment, the meter modules 46 can be arranged in two columns or banks extending from an upper end of the meter system to a lower end of the meter system. Further, in some embodiments, each column can include an associated set of indicator lights 48. As shown in FIG. 5, in some embodiments, one or more of the meter modules 46 can be removed or inserted, replaced, or exchanged into or out of a meter module slot 52, as shown by the assembly view of meter module 50, with each meter module 46 being positioned into a respective slot 52 positioned in the base of the meter system 40. In some embodiments, the meter system 40 can be operational with all meter slots 52 including a meter module 46. In some embodiments, at least some of the meter slots 52 can be empty, whereas other meter slots 52 can include a functioning meter module 46.

Some embodiments include a high voltage input and output from the meter system 40. In reference to FIG. 5, in some embodiments, the meter system 40 can include a high voltage supply line 42 extending into the housing of the meter system 40. In some embodiments, the high voltage supply line 42 can be fed to one or more columns or banks of meter modules 46. In some embodiments, the high voltage supply line can be fed to one or more columns or banks of meter modules (see for example FIG. 4).

Figure 7:
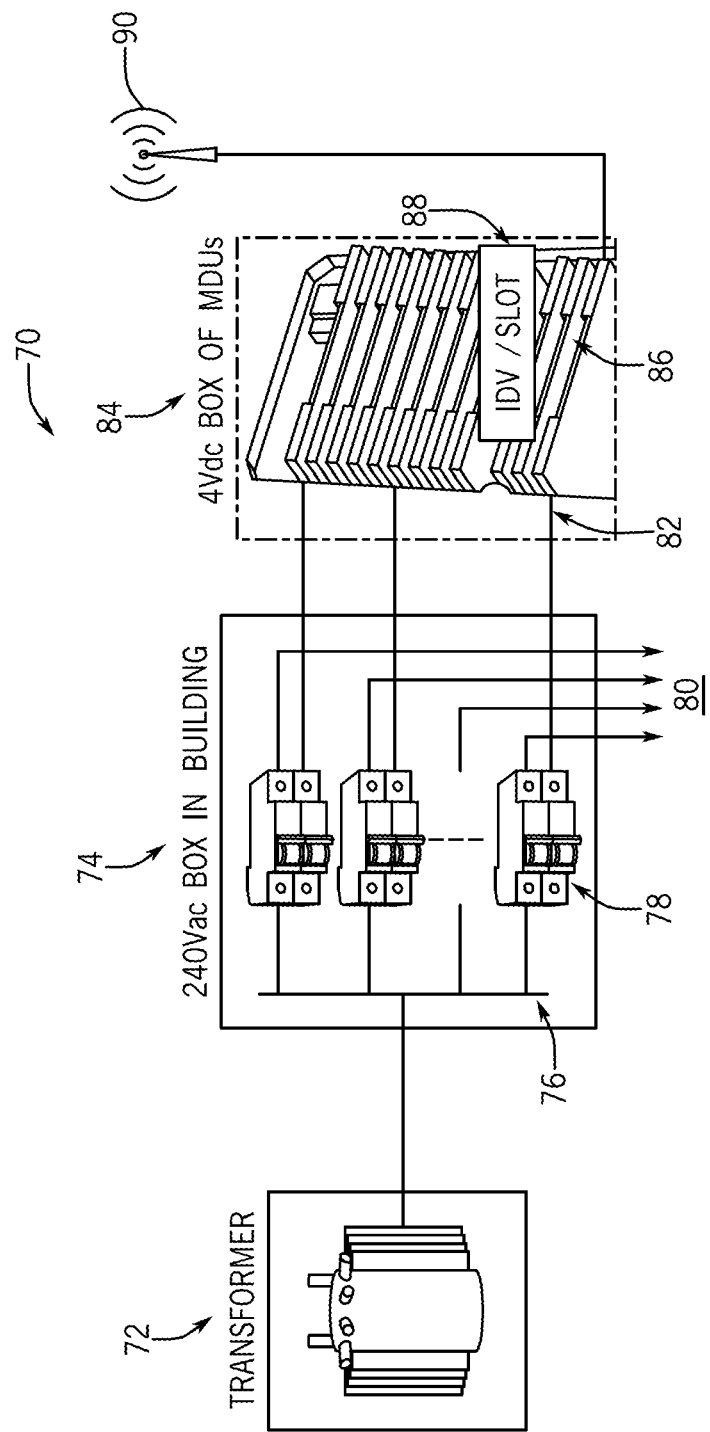
FIG. 7 is a multi-purpose unit system architecture in accordance with some further embodiments of the invention.

A non-limiting voltage supply and feed architecture embodiment is shown in FIG. 7 showing a multi-dwelling unit system architecture 70 in accordance with some further embodiments of the invention. The multi-dwelling unit system architecture 70 depicts a power line from a transformer 72 extending to a power distribution array or box 74 in a building, and power extending from the power distribution array or box 74 to a meter system 84 (where the "box of MPM's/MDU's" of meter system 84 can comprise the aforementioned meter system of FIG. 3 or FIGS. 4-6). For example, some embodiments include a power line extending from the transformer 72 to a power bus 76 in a 240 Vac box in a building (power distribution array or box 74), and power lines extending to individual apartments from remote disconnect junctions (shown as 80). In some embodiments, voltage and current include low Vac and Iac (82) can extend from the junctions to a 4Vdc box of meter module comprising slots 88 of which some include meter modules 86 (which can be meter modules 46). In some embodiments, at least one of the meter modules 86 can comprise a master meter module. Further, as depicted, some embodiments include an RF antenna coupled to one or more of the meter modules (e.g., such as the master meter module). In some embodiments, the power distribution array or box 74 can include a remote disconnect 78 to enable a remote disconnection of power into or out of the power distribution array or box 74. Further, in some embodiments, the meter system 84 can comprise at least one wireless antenna and/or transceiver 90 to enable remote control and/or monitoring.

Figure 8:
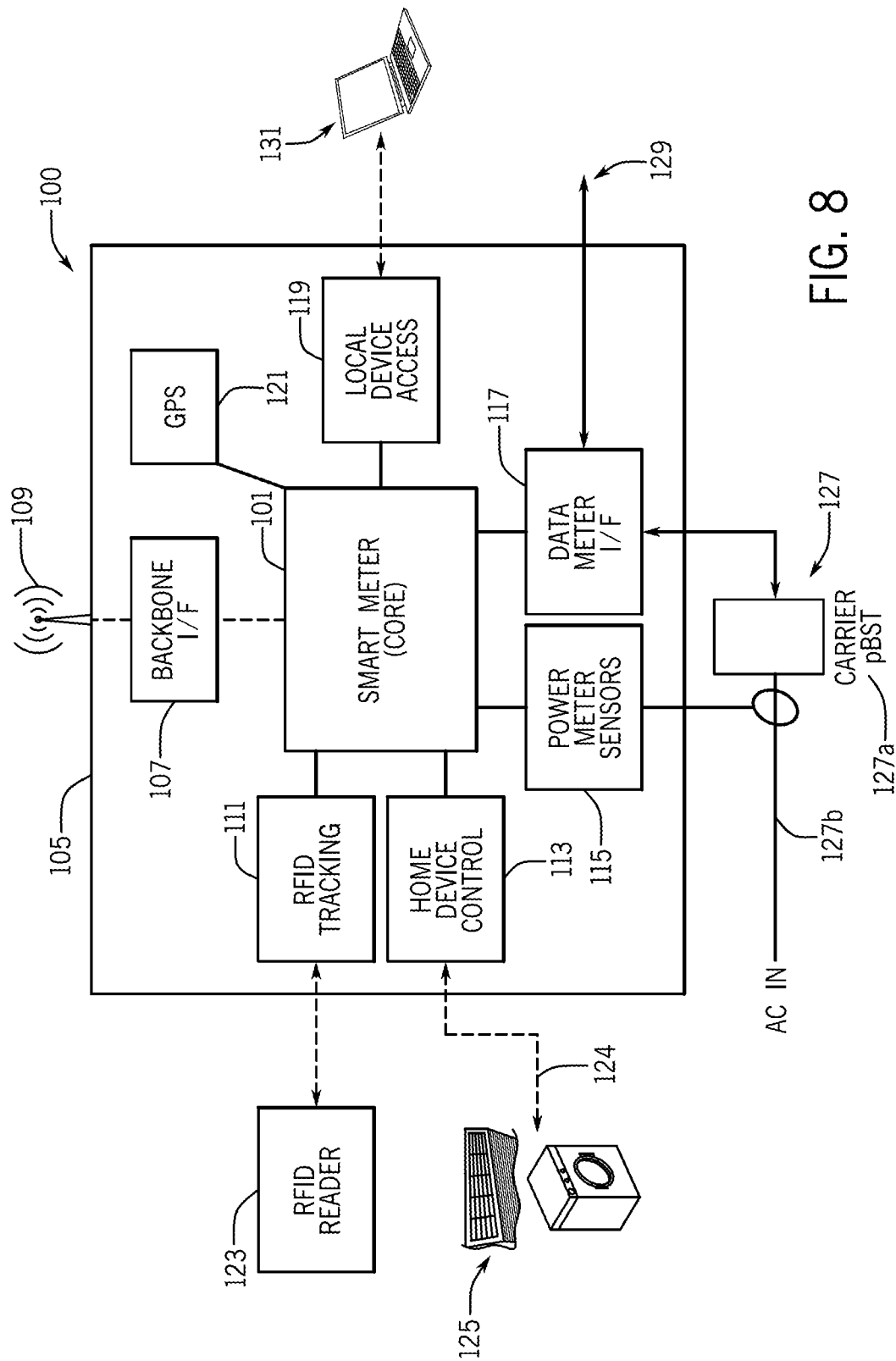
FIG. 8 illustrates a metering system architecture of an electric meter according to embodiments of the invention.

FIG. 8 illustrates a metering system architecture 100 of an electric meter (e.g., such as any of the meter systems and/or meter modules described earlier including meter system 84 and/or meter modules 46) according to embodiments of the invention. In some embodiments of the invention, the system architecture 100 can comprise an electric meter or module 105 including a meter core 101 coupled to one or more data transfer and/or processing functions, or assemblies such as an input/output front end backbone 107. As illustrated, in some embodiments, the meter core 101 can include or be coupled to at least one data transfer functionality or assembly. In some embodiments, at least a portion of the at least one data transfer functionality or assembly can be integral to the meter core 101 and/or can be coupled to the meter 101 as part of the metering system architecture 100. Further, in some embodiments, the metering system architecture 100 can include an electric meter assembly and/or meter base that can be equipped with one or more wireless communication technologies with RF module 109 that can be used to receive data or information and/or can be used to transmit data or information (shows as using wireless transmission in this non-limiting embodiment). In some embodiments, the electric meter assembly of the electric meter or module 105 can include at least one RF module 109, including, but not limited to, receivers, transmitters or receivers and/or a combination thereof. In some embodiments, the RF module 109 can comprise transceiver capability including cellular 5G, 4G/LTE, and/or Wi-Fi, and/or WiMAX, and/or Wi-Sun, and/or 400 MHz and/or 900 MHz frequency transceiver capability, GPS 121, Bluetooth®, or a combination thereof.

In some embodiments, any RF module 109 of the metering system architecture 100 can be coupled to a fixed energy meter (e.g., such as meter core 101 of electric meter or module 105). For example, in some embodiments, the RF module 109 can be mounted or otherwise coupled or integrated with a fixed energy meter (e.g., coupled or integrated with electric meter or module 105). In some other embodiments, the RF module 109 can be mobile and not mounted or otherwise physically coupled to electric meter or module 105. In some embodiments, the RF module 109 can be removably mounted or coupled to an energy meter. In some embodiments, when the RF module 109 is mounted or coupled to the energy meter, information can be transferred between the energy meter and the RF module 109. In some embodiments, a user can move the RF module 109 to within a specific distance from the energy meter to enable transfer of information between the RF module 109 and the energy meter. The specific distance includes distances that are known in the art for RF data transmission distances for known RF standards (described below).

Some embodiments of the invention can include at least one RFID module 111 that can provide tracking and asset management capability. Some embodiments of the invention also include an RF module 109 that can provide sub-metering and communication interconnections between sub-meters and main meters, and interconnectivities with other sub-meters. Moreover, in some embodiments of the invention, the metering system architecture 100 can provide services such as Internet, home phone, TV, and/or video. For example, some embodiments include RFID tracking that can form a communication channel or link with an RFID reader 123 as shown. In some embodiments, the RFID module 111 can comprise a variety of modules types, including common RF protocols and standards. For example, in some embodiments, the RFID module 111 can include class 1 including a simple, passive, read-only backscatter tag with one-time, field-programmable non-volatile memory. Other embodiments can utilize class 2, a passive backscatter tag with up to 65 KB of read-write memory. Other embodiments can use a class 3: a semi-passive backscatter tag, with up to 65 KB read-write memory; essentially, and with a built-in battery. Some further embodiments include Class 4: an active tag with built-in battery, an internal transmitter for transmitting to the reader. Some further embodiments can implement a class 5: an active RFID tag that can communicate with other class 5 tags and/or other devices.

In some embodiments, the RFID module 111 can be enabled to include RFID standards for automatic identification and item management (ISO 18000 series standards). Some embodiments of the invention include an 18000-1 standard that uses generic parameters for air interfaces for globally accepted frequencies. Some embodiments can use an 18000-2 standard with an air interface for 135 KHz. Some further embodiments can use an 18000-3 standard with an air interface for 13.56 MHz. In some other embodiments of the invention, the RFID module 111 can be enabled to include standard 18000-4 that can use an air interface for 2.45 GHz. In some other embodiments of the invention, standard 18000-5 with an air interface for 5.8 GHz can be used. In some other embodiments, standard 18000-6 with an air interface for 860 MHz to 930 MHz can be used. In some alternative embodiments, standard 18000-7 with an air interface at 433.92 MHz can be used. Some further embodiments include RF components operating at a 2.4 GHz-ISM frequency band. Some embodiments include one or more integrated communication functions, including, but not limited to, a licensed 400 MHz band, an un-licensed 900 MHz band, Wi-Fi, Bluetooth®, ZigBee®, 4G cellular, RFID, and GPS (GPS 121). Some embodiments include an RF system and method of operation compatible with Bluetooth® and IEEE 802.11x within a mobile device. Bluetooth® is a registered trademark of Bluetooth® SIG Inc. ZigBee® is a registered trademark of ZigBee Alliance Corporation.

In some embodiments, the metering system architecture 100 can include a local device access through a link. In some embodiments, a user device 131 can access the metering system architecture 100 using the local device access 119. Some further embodiments include a carrier data connection coupled to data meter. For example, some embodiments include a data meter 117 through coupled through more or more links 127, 129 for data transfer and communication including coupling to "carrier pBST" 127*a*. Some embodiments include power meter sensors 115 coupled to A/C (127*b*). In some embodiments, the meter core 101 can be networked to control one or more devices or appliances. For example, in some embodiments, the electric meter or module 105 can include home device control 113. In some embodiments, one or more appliances 125 can be coupled to and/or controlled or monitored with a link (e.g, a wireless or wired link 124.

Figure 9:
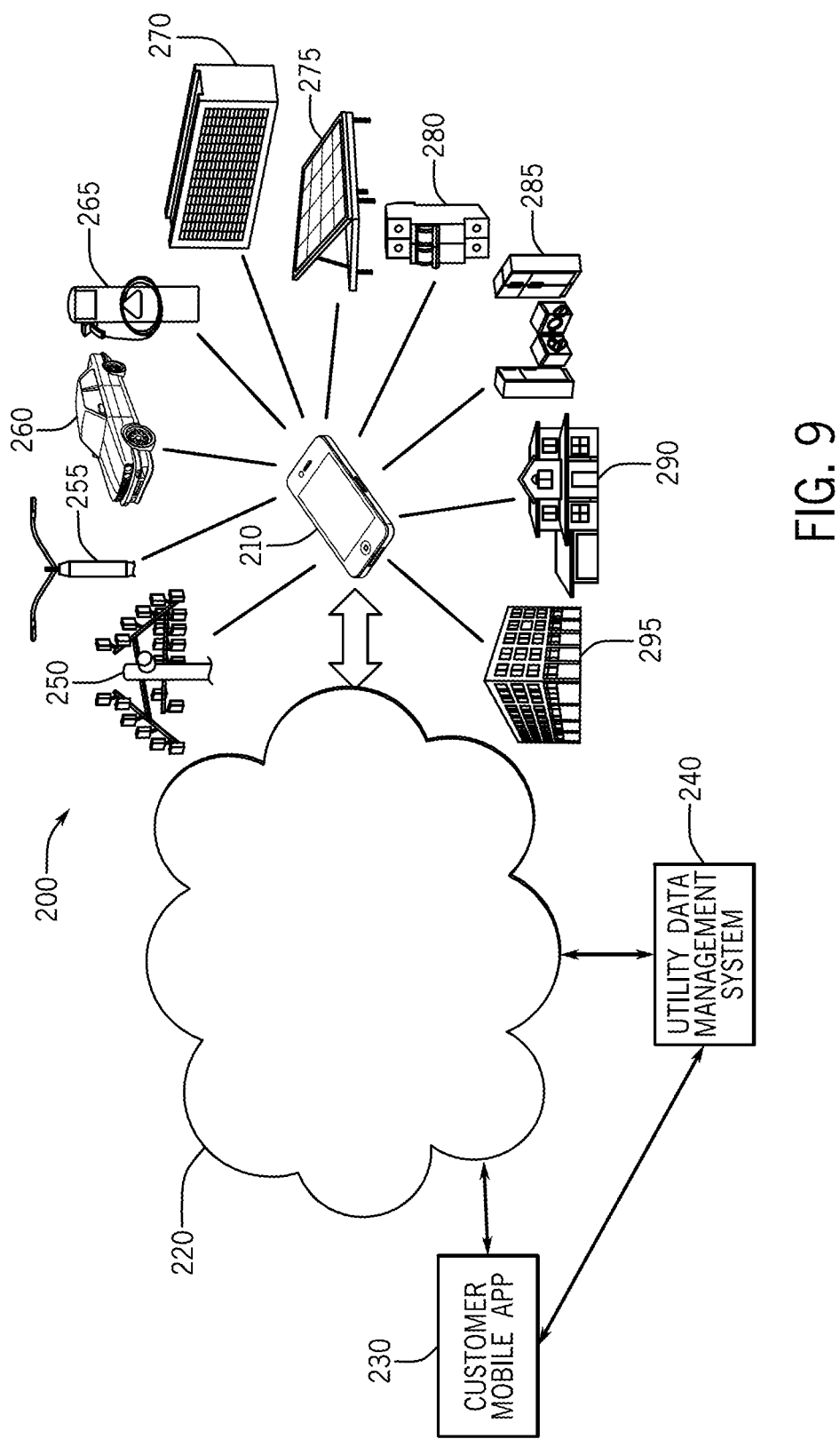
FIG. 9 illustrates a system network including an electric meter in accordance with some embodiments of the invention.

In some embodiments of the invention, the metering system architecture 100 can be modular and enable mobility, and be configured for multi-network and cloud-computing. In some embodiments of the invention, one or more components, modules or assemblies of the electric metering system can form part of a cloud-computing network. In some embodiments, cloud-computing (e.g., in the form of one or more cloud computers, one or more cloud servers, and/or one or more cloud storage devices) can be used to store, process, and transmit information to and from at least one component, modules or assembly of the electric metering system. For example, FIG. 9 illustrates a system network 200 including at least one electric meter 210 in accordance with some embodiments of the invention. In some embodiments, the aforementioned meter modules 46, 50 can comprise the electric meter 210. In some embodiments, the system network 200 can comprise a cloud computing system or server 220 coupled to the at least one electric meter 210. In some embodiments, the user can access the electric meter 210 and/or any data from the electric meter 210 using a customer mobile application 230 coupled to a utility data management system 240. In some embodiments, options for customer interface through the use of mobile applications can be accommodated using the cloud-computing system network 220. In some embodiments, the customer can deploy at least one energy meter at, for example, a fixed location (such as a residential or commercial building or business), and monitor a variety of parameters obtained from the meter at the location or at a remote location using a mobile device. For example, in some embodiments, the customer can use a mobile laptop computer and/or mobile phone or smart phone to monitor at least one parameter of the energy meter. In some further embodiments, personal digital assistants, pagers, digital tablets, or other processor-based devices can be used to access the cloud resource either through a wireless (e.g., a cellular or Wi-Fi signal) or through a wired link coupled to the cloud computing system or server 220.

In some embodiments of the invention, the meter system architecture 200 can be mounted or coupled to multiple applications such as buildings 295, and/or homes 290, and/or appliances 285, and/or circuit breakers 280, and/or PVs 275, and/or battery storage units 270, and/or charging stations 265, and/or vehicles such as electric or plug-in hybrid vehicles 260, and/or light poles 255, and/or microcell tower/poles 250, etc. In some embodiments, the meter system architecture 200 can perform, provide, store, and poll, communicate, and/or transfer routinely, on demand, and ad-hoc, telecommunication bits/bytes metrology in utility cloud-computing and/or in the meter 210. In some embodiments, meter system architecture 200 can process and communicate data through the cloud-based server and/or computing system 220, including, but not limited to, energy data such as interval kWh and kVARh, and/or operations information such as real-time voltage and current, grid awareness information, and/or meter location (e.g., for any fixed or mobile meter), and/or provide access as a data portal for a third party.

In some embodiments of the invention, power quality information, voltage, current and phase angle values at a user-specified interval, and/or sampling technique on phase voltage and current wave forms can be used by the meter system architecture 200 to provide a variety of energy metrics. For example, in some embodiments, the meter system architecture 200 can calculate the energy usage, and/or interval temperature, electric energy kWh and kVARh values in a user-specified period, and/or perform electric service analyses to detect wrong meter base installations, and/or electric service analyses and information to detect tampering and provide potential tampering leads. Further, for example, in some embodiments, through at least one cloud resource (e.g., such as a cloud-based server and/or computing system 220), one or more electric meters (e.g., meter 210) can couple to a utility data management system such as utility data management 240, and transmit the variety of parameters mentioned earlier. In this instance, information such as energy use (kWh and kVARh), operation function such as real time (or substantially real time) voltages and current, and grid awareness such as the physical location of a mobile electric meter can be processed through the cloud resource linked with a utility data management (system utility data management).

Some embodiments can include provisions for phase voltage, current and phase angle in real (or substantially real) time in a full scale, or by designation or during emergency and/or power outage and restoration situations. In some embodiments, computation of kWh consumption and other power metrics can be performed by cloud-computing with various communication back-haul options (e.g., such as through cloud-based server and/or computing system 220). This embodiment exemplifies a very different philosophy from the more typical "smart meter" philosophy by performing analyses and computations in the cloud instead of at the meter.

In some embodiments, the meter system architecture 200 can function as a telecommunication conduit for other services such as internet, video, TV, advertisements, etc. Moreover, in some embodiments, using customer identification information, the electric metering system 200 can function as a telecommunication conduit for services (i.e. internet, video, TV, advertisements, etc.) that are tailored or targeted to the customer's needs, preferences, or geographic location. In some embodiments, the meter system architecture 200 can generate licensing fees for revenues that can help lower the customer's energy rate. Further, in some embodiments, the meter system architecture 200 can enable customers to be informed about commercial services, public safety (i.e. shopping, police, fire, hospital, etc.), and can be used to improve public and personal safety (i.e. in emergency situations, such as accidents, stranded vehicle, etc.). Some embodiments can also include electrical outage and gas/water leakage monitoring and/or call notifications and identifications. Further, some embodiments can function as, or couple to, telecom hubs that can provide improved bandwidth for field personnel communications and provide mobile telemetry. In some embodiments, the system can provide local, area-wide, and/or global Internet services.

In some embodiments, the meter 210 can be associated with or coupled to a partial electric vehicle, and/or an electric charger, and/or battery storage, and/or a photovoltaic system, and/or a circuit breaker, and/or appliances, and/or infrastructure. In the latter example embodiments, a mobile energy meter and remote application (e.g., such as customer mobile application 230) can be used to guide customers as to when and where to plug in their vehicle, either to charge or discharge, and thus potentially lowering operating and maintenance costs of their vehicle. In some embodiments, this can enable customers and utilities to better manage EV loads (when charging) and generations (when discharging), and help lower costs of the grid construction, maintenance and operation. Thus, in some embodiments, EVs with embodiments of the mobile meters described herein can support and benefit the electrical grid system, and customers can be provided with real time charging/discharging cost and kWh quantity.

In some embodiments, the electric meter 210 or meter system architecture 200 can function to provide vehicle telemetry and/or form part of a self-driving infrastructure. In some embodiments, using a combination of smart poles and/or micro cell sites, the electric metering system relay vehicle telemetry information, and provide remote monitoring of charge/discharge within an electric vehicle route. Furthermore, because the cloud-based system can be managed and/or coupled to at least one utility data management system, the system can be used to guide customers when and where to plug in either to charge or discharge based on location, charging station status, local and area-wide grid loads, etc., providing real time location based charge/discharge updates, operating with real time data on the grid.

Figure 10:
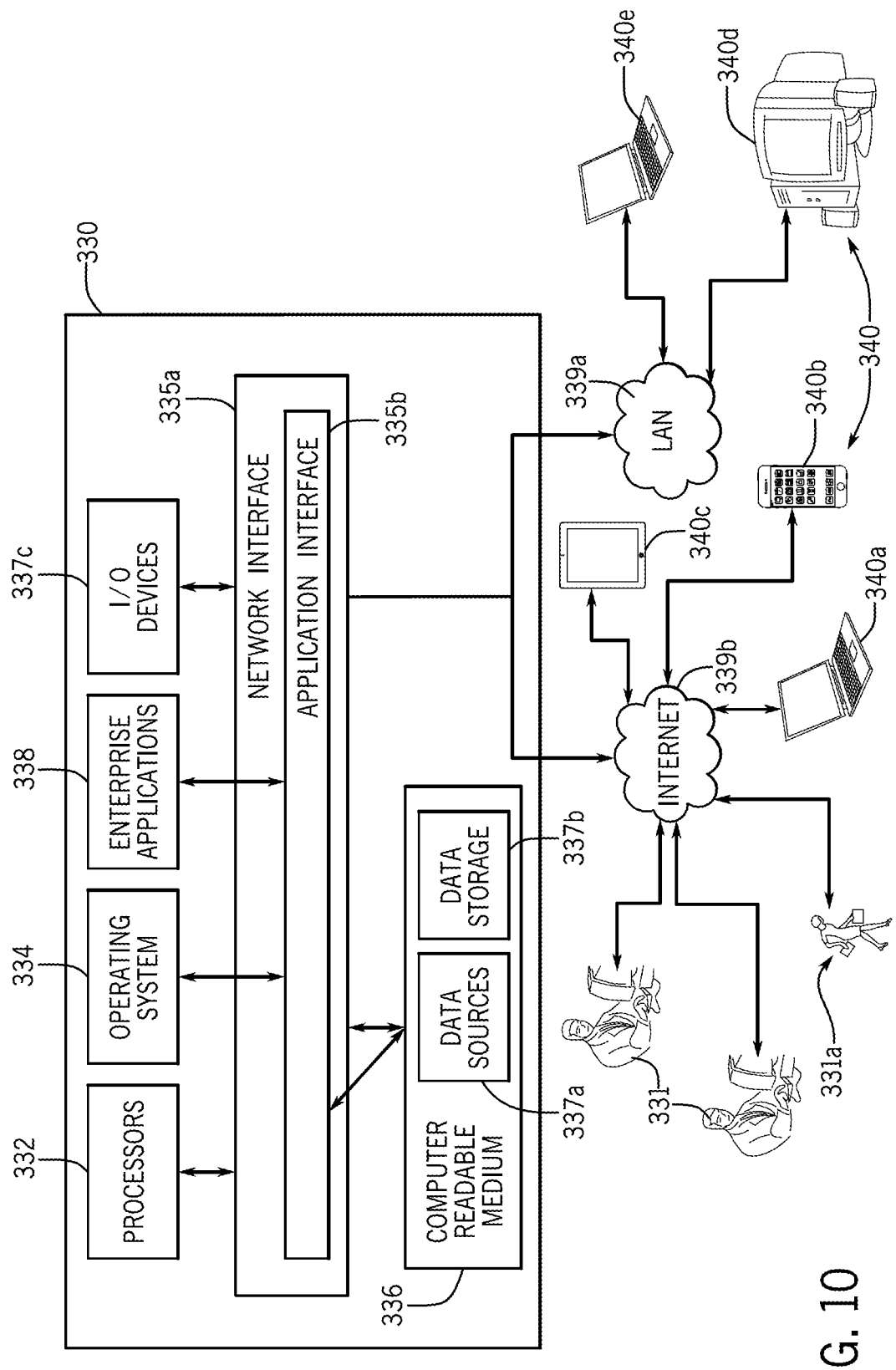
FIG. 10 illustrates a computing system for operating communication and/or data transfer protocols of an energy metering system and method in accordance with some embodiments of the invention.

In some embodiments, the meter system architecture 200 can comprise or couple to a cloud computing system or server illustrated in FIG. 10. In some embodiments, computing system 330 can be suitable for managing and operating the processing, communication, and data transfer protocols of the meter system architecture 200. For example, in some embodiments, the computer system 330 can include at least one computing device, including one or more processors 332. Some processors 332 can include processors residing in one or more conventional server platforms. In some embodiments, the computer system 330 can include a network interface 335a and an application interface 335b coupled to at least one processor 332 capable of running at least one operating system 334 and/or one or more of the software modules (e.g., enterprise applications 338). In some embodiments, the software modules 338 can include a server-based software platform that can include energy metering system and method software modules suitable for hosting at least one user account and/or at least one client account, as well as being capable of transferring data between one or more accounts.

Some embodiments of the invention relate to a device or an apparatus for performing these operations. In some embodiments, the apparatus can be specially constructed for the required purpose, such as a special purpose computer. When defined as a special purpose computer, the computer can also perform other processing, program execution or routines that are not part of the special purpose, while still being capable of operating for the special purpose. Alternatively, in some further embodiments, the operations can be processed by a general-purpose computer selectively activated or configured by one or more computer programs stored in the computer memory, cache, or obtained over a network. In some embodiments, when data are obtained over a network the data can be processed by other computers on the network, e.g. a cloud of computing resources (e.g., such as cloud computing system or server 220).

With the above embodiments in mind, it should be understood that the invention can employ various computer-implemented operations involving energy and data/information metering systems and methods data stored in one or more computer systems. Moreover, various databases and models can throughout the described energy metering systems and methods can store analytical models and other data on computer-readable storage media within the computer system 330, and on computer-readable storage media coupled to the computer system 330. In addition, the above-described applications of the energy metering system and method can be stored on computer-readable storage media within the computer system 330 and on computer-readable storage media coupled to the computer system 330. These operations are those requiring physical manipulation of physical quantities. Usually, though not necessarily, these quantities take the form of electrical, electromagnetic, or magnetic signals, optical or magneto-optical form capable of being stored, transferred, combined, compared and otherwise manipulated.

In some embodiments, the computer system 330 can comprise at least one computer readable medium 336 coupled to at least one data storage device 337b, and/or at least one data source 337a, and/or at least one input/output device 337c. In some embodiments, the invention embodied by the energy metering systems and methods described herein can be implemented as computer readable code on a computer readable medium 336. In some embodiments, the computer readable medium 336 can be any data storage device that can store data, which can thereafter be read by a computer system (such as the computer system 330). Examples of the computer readable medium 336 can include hard drives, network attached storage (NAS), read-only memory, random-access memory, FLASH based memory, CD-ROMs, CD-Rs, CD-RWs, DVDs, magnetic tapes, other optical and non-optical data storage devices, or any other physical or material medium which can be used to tangibly store the desired information or data or instructions and which can be accessed by a computer or processor (including processors 332).

In some embodiments of the invention, the computer readable medium 336 can also be distributed over a conventional computer network via the network interface 335a so that the energy metering system and method embodied by the computer readable code can be stored and executed in a distributed fashion. For example, in some embodiments, one or more components of the computer system 330 can be tethered to send and/or receive data through a local area network ("LAN") 339a. In some further embodiments, one or more components of the computer system 330 can be tethered to send or receive data through an internet 339b (e.g., a wireless internet). In some embodiments, at least one software application 338 running on one or more processors 332 can be configured to be coupled for communication over a network 339a, 339b. In some embodiments, one or more components of the network 339a, 339b can include one or more resources for data storage, including any other form of computer readable media beyond the media 336 for storing information and including any form of computer readable media for communicating information from one electronic device to another electronic device.

In some embodiments, the network 339a, 339b can include wide area networks ("WAN"), direct connections (e.g., through a universal serial bus port) or other forms of computer-readable media 336, or any combination thereof. Further, in some embodiments, one or more components of the network 339a, 339b can include any number of client devices (e.g., such as user device) that can be personal computers 340 including for example desktop computers 340d, laptop computers 340a, 340e, digital assistants and/or personal digital assistants (shown as 340c), cellular phones or mobile phones or smart phones (shown as 340b), pagers, digital tablets, internet appliances, and other processor-based devices. Other client devices can be any type of external or internal devices such as a mouse, a CD-ROM, DVD, a keyboard, a display, or other input or output devices 337c. In some embodiments, various other forms of computer-readable media 336 can transmit or carry instructions to a computer 340, including a router, private or public network, or other transmission device or channel, both wired and wireless. In some embodiments, the software modules 338 can be configured to send and receive data from a database (e.g., from a computer readable medium 336 including data sources 337a and data storage 337b that can comprise a database), and data can be received by the software modules 338 from at least one other source. In some embodiments, at least one of the software modules 338 can be configured within the system to output data to a user 331, or mobile user 331a via at least one digital display (e.g., to a computer 340 comprising a digital display).

In some embodiments, the computer system 330 as described can enable one or more users 331, 331a to receive, analyze, input, modify, create, and/or send data to and from the computer system 330, including to and from one or more enterprise applications 338 running on the computer system 330. Some embodiments include at least one user 331, 331a coupled to a computer 340 accessing one or more modules of the energy metering system and method including at least one enterprise applications 338 via a stationary I/O device 337c through a LAN 339a. In some other embodiments, the computer system 330 can enable at least one user 331, 331a (through computer 340) accessing enterprise applications 338 via a stationary or mobile I/O device 337c through an internet 339a.

Figure 11:
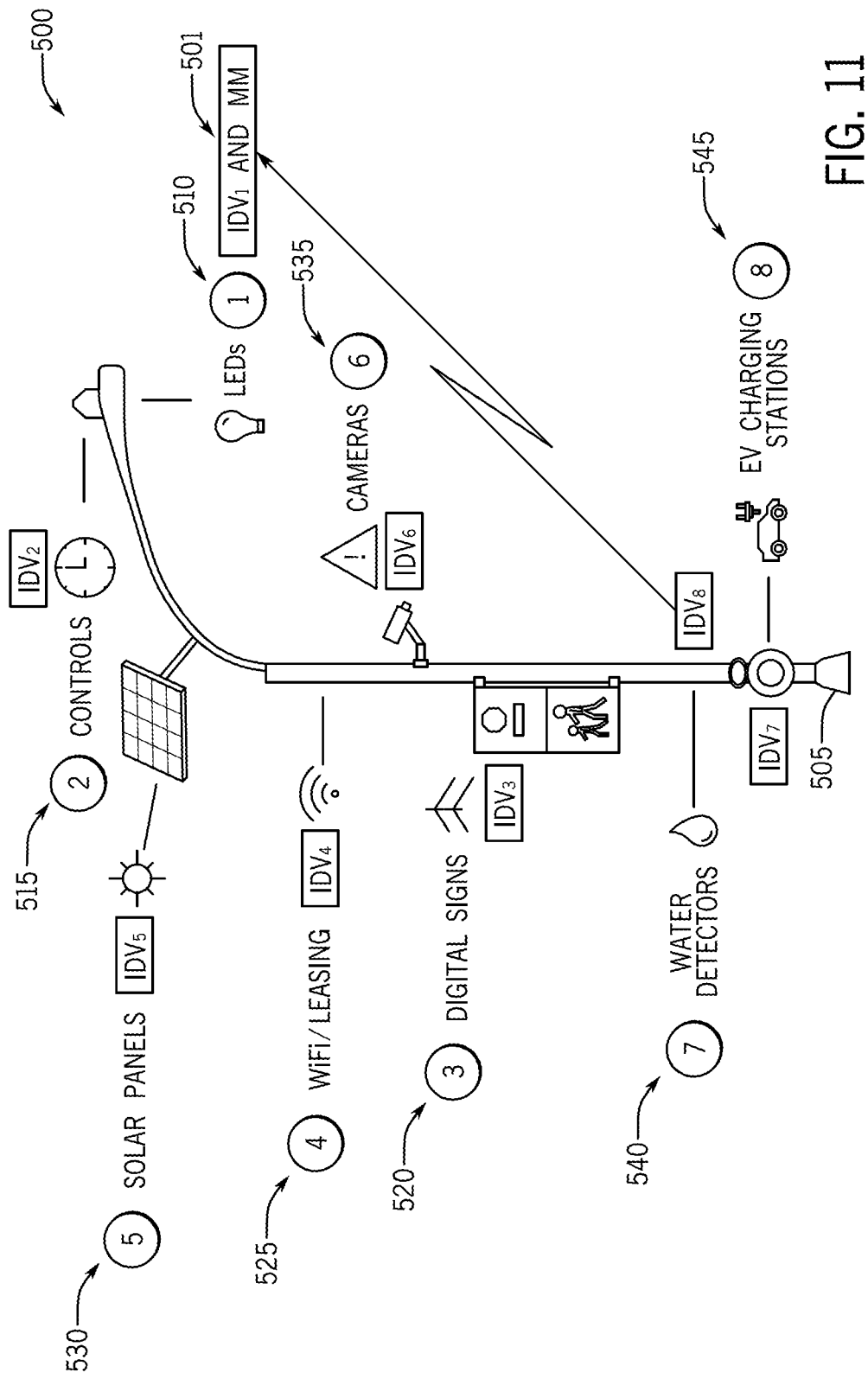
FIG. 11 is a multi-tenant unit street-pole system architecture in accordance with some further embodiments of the invention, in which each IDV (individual) unit meter serves a separate tenant on the street-pole system.

In some embodiments of the invention, one or more components, modules or assemblies of the meter system architecture 200 can be integrated with various other systems to provide additional and/or augmented functions. For example, some embodiments include a street poles that can include an electric and data meter (represented as smart pole 505 in the multi-tenant unit street-pole system architecture 500 of FIG. 11), where "IDV1 and MM" (501) represents an individual meter functioning as a meter manager unit that can serve as a hub and communicate and connect the other IDV meters to the head-end application.

In some embodiments, a meter system architecture 200 integrated within the street-pole system architecture 500 can include LED lighting functions 510, control system 515, digital signage 520, Wi-Fi leasing, solar panels 530, one or more cameras 535, water detectors 540, and electric vehicle charging capabilities. In some embodiments, the system architecture 500 can include at least one gas meter, multi-color streetlights (LED lighting functions 510), electric vehicle induction charging 545, data and information metering systems, streetlight metering, telecommunications data metering and/or and vehicle telemetry. Accordingly, in some embodiments, using meter system architecture 200, and one or more of the aforementioned systems, the street-pole system architecture 500 can monitor electrical outages, gas/water leakage, and usage information/data in real time.

In some embodiments, when coupled to a cloud system (such as the cloud computing system or server 220 described above with respect to FIGS. 9 and 10), billing information can be processed and billing data transferred to the utility MDM by the meter system architecture 200, and can be utilized across a wide variety of applications, including, but not limited to, fixed premises, circuit breakers, appliances, electric and/or plug-in vehicles, photovoltaic systems, electric charging stations, battery storage, microcell tower/pole assemblies and systems, etc., capable of monitoring phase voltage, current and angle real time. In some embodiments, the meter system architecture 200 can provide hotspot services (Internet, home/car/cell phone, TV, Video, etc.). In some embodiments, one or more modules of the meter system architecture 200 can provide one or more web-enabled applications providing customer access to various metering services, including, but not limited to, billing, energy (and/or gas, water, data, information, etc.) usage and statistics, current energy (and/or gas, water, data, information, etc.) use and system/device status. In some embodiments, one or more components, modules or assemblies of the meter system architecture 200 can use the cloud computing system or server 220 to provide remote photographic and/or video monitoring. In some other embodiments, the 210 of the meter system architecture 200 can provide cloud-enabled real-time voltage, leak detection and pressure information (e.g., for gas and water utility systems), streetlights with dimming ability, emergency flash functions, etc.

In some further embodiments, one or more components, modules or assemblies of system network can use the cloud computing system or server 220 to monitor, meter, and/or control color-coded lights for safety on pedestrian, streets and/or traffic areas. In some embodiments, street poles, such as smart pole 505 of the multi-tenant unit street-pole system architecture 500 of FIG. 11 can include multi-colored street lights (such as LED lighting functions 510) for improved visual safety indications to the general-public, to first aid responders, and to law enforcement when responding to any emergency situations. In other embodiments of the invention, one or more components, modules or assemblies of system network can use the cloud computing system or server to provide gunshot detection. Further, in some embodiments, street poles, such as smart pole 505 can use the multi-color streetlight function for festive or holiday light decors and displays. In some embodiments, the integrated smart pole 505 can use the multi-color streetlight function for festive or holiday light decors and displays including, but not limited to, white, and/or red, and/or amber, and/or blue, and/or green flashing turned on during a holiday season and/or a public event such as a parade. In some embodiments, a multi-color enabled street light housing can include a plurality of different light sources capable of emitting a plurality of colors or light wavelengths from the smart pole 505 (using, for example, a plurality of LED light sources 510). In some further embodiments, the LED light sources can include multi-color (e.g., white, red, amber, blue and/or green) light emission. Some embodiments of the invention include a plurality of LED light sources where the LED light sources each emit a different color than each other (i.e., no LED light source emits a color that is the same as another LED light source in the housing). In some further embodiments, the plurality of LED light sources can include duplicated colors where the housing includes two or more LED light sources that emit substantially the same colored light. In some embodiments, the plurality of light sources can be positioned in a specific arrangement in the housing. For example, in some embodiments, LED light sources can be evenly distributed or positioned in the housing. In other embodiments, the LED light sources can be unevenly distributed or positioned in the housing. For example, some embodiments include groups or clusters of LED light sources. In some embodiments, the groups or clusters can comprise LED light sources with the same color. In some other embodiments, at least one of the groups or clusters can comprises LED light sources with at least two different colored LED light sources. In some other embodiments, any one of the LED light sources can comprise a multi-color emission capable LED light source. For example, some embodiments include at least one LED light source that can be controlled or switched from one color emission to at least one other color emission. In some further embodiments, the smart pole 505 can include at least one meter associated with a customer's digital sign (520). In other embodiments, the smart pole 505 can include at least one meter associated with a customer's leasable Wi-Fi (525). In some further embodiments, the smart pole 505 can include at least one meter associated with a customer's water detector (540). In some further embodiments, the smart pole 505 can include at least one meter associated with a customer's solar panel (530). In some further embodiments, the smart pole 505 can include at least one meter associated with a customer's camera (e.g., such as a surveillance camera, shown as 535).

In some embodiments, the smart pole 505 can be programmed for safety and/or security applications. In some embodiments of the invention, the smart pole 505 can comprise a multi-color enabled street light housing with one or more flashing light sources, one or more light sources capable of creating an animation, or one or more LED light sources that can be pulsed, flashed, and animated. For example, some embodiments include red LEDs that can be flashed, pulsed, and/or animated when there is a medical emergency or dangerous situation requiring immediate attention. Some further embodiments can include amber LEDs that can flash or pulsate when there is a caution condition requiring attention and/or speed reduction (i.e., warning of road construction, an accident, foggy weather, an amber alert, etc.) Some other embodiments of the invention include one or more blue light emitting LEDs that can be configured to flash or pulsate when there is a non-emergency situation requiring attention or escort.

In some further embodiments, the smart pole 505 can be integrated or coupled with various system components including, but not limited to, one or more energy meters, a control relay for controlling a meter, one or more communication systems such as a cellular module, and/or a Wi-Fi modem, a data meter, a sound detector, a camera and/or motion detector, and/or a two-way intercom. In some embodiments, the smart pole 505 including any of the components or systems described above can be integrated with a monitoring and control system. In some embodiments, any conventional advanced metering infrastructure (AMI) or automated meter reading (AMR) systems (e.g., such as MV-90, which is a product sold by Itron, Inc.), and/or any wireless network and meter (e.g., such as meter 210) can be used to monitor and control one or more smart poles 505. For example, in some embodiments, by coupling to an AMI network, users can access and/or monitor any smart pole 505. In some embodiments, access, monitoring, and/or control can be accomplished through at least one operational system including, for example, an AMI operating system, data analytics, and associated street light control software. In some embodiments, other communication systems and protocols can be used including, but not limited to 4G/LTW, Wi Sun, and 400 MHz and 900 MHz RF. In some embodiments, one or more smart poles 505 can couple into a system such as the monitor and control system to provide billing calculations and processing for one or more utility companies, and can process and distribute one or more utility bills to one or more utility customers.

Figure 12:
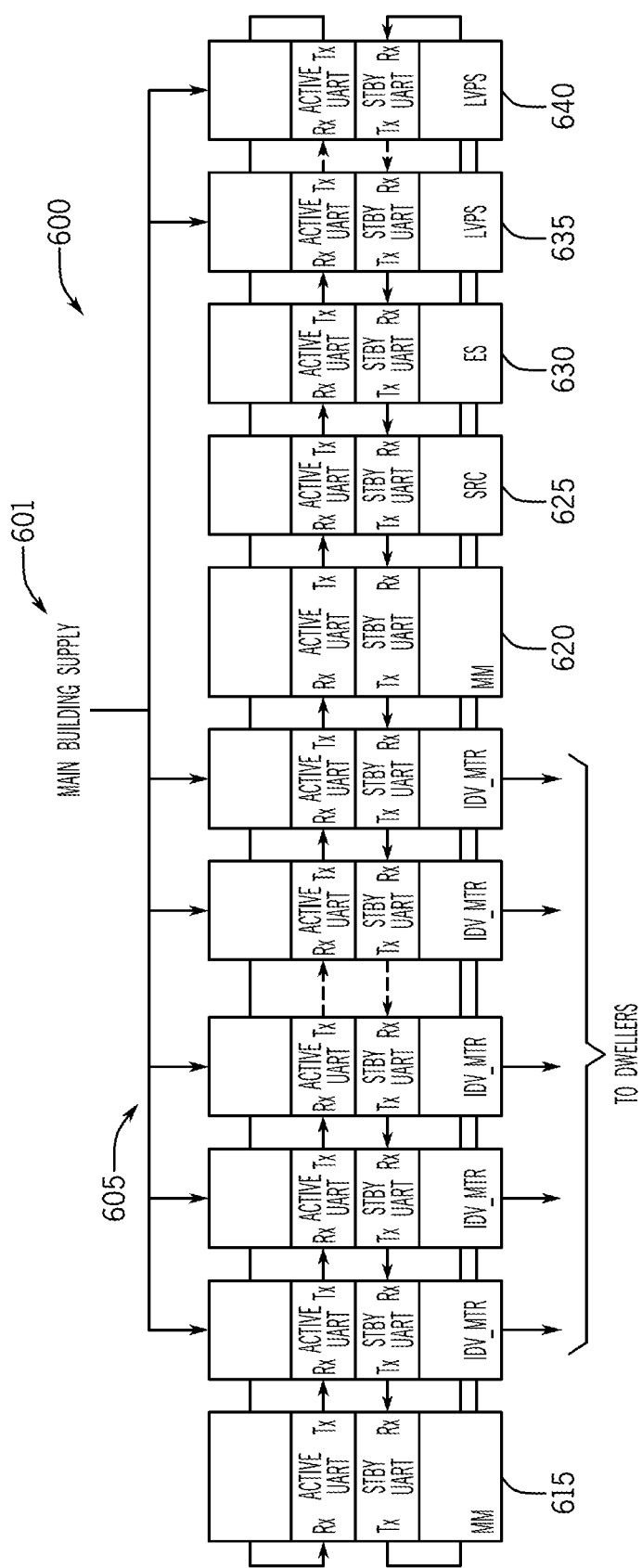
FIG. 12 is a multi-purpose unit system architecture in accordance with some further embodiments of the invention.

FIG. 12 is a multi-dwelling unit system architecture 600 in accordance with some further embodiments of the invention. In some embodiments, the multi-dwelling unit system architecture 600 can include a plurality of meter modules coupled to a main power supply 601 including high and low voltage modules, master modules, and optical redundancy modules, and various control and operational programs. For example, some embodiments include a head-end operations application, one or multiple meter managers 615 ("MM 615") and individual meters ("IDVs") 605. In some embodiments, the MM 615 can conduct handshakes and communications with one or more of the IDVs 605. In some embodiments, the MM 615 can collect data (e.g., such as kWh, kVARh, voltage and current values) from one or more of the coupled IDVs 605. For example, using one or more communication technologies, including any one or more of the aforementioned communication functions, including, but not limited to, wired, 400 MHz band wireless, 900 MHz band wireless, Wi-Fi, Bluetooth®, ZigBee®, 4G, 5G cellular, RFID, and GPS (GPS 121).

In some embodiments, the MM 615 can process and transmit the IDV data to other MMs, other data collectors, or directly to a head-end application (e.g., such as an application of the system 330 or other coupled meter control system). In some embodiments, the IDVs 605 can register and handshake with the MM 615, collect and transmit their data at the very short intervals (seconds or milliseconds). In some further embodiments, the IDVs 605 can hop between themselves to relay the data to the MM 615. In some embodiments of the invention, the head-end operations application can be designed to collect the data from MM 615 (i.e. interval usage, voltage, outage, restoration, alarms, etc.), frame, and pass the data to a meter data management for a validating, estimating, editing ("VEE") process prior passing it on to electricity customer care and billing ("CC&B") for billing and other information to a database for grid monitoring and operational purposes.

Figure 13:
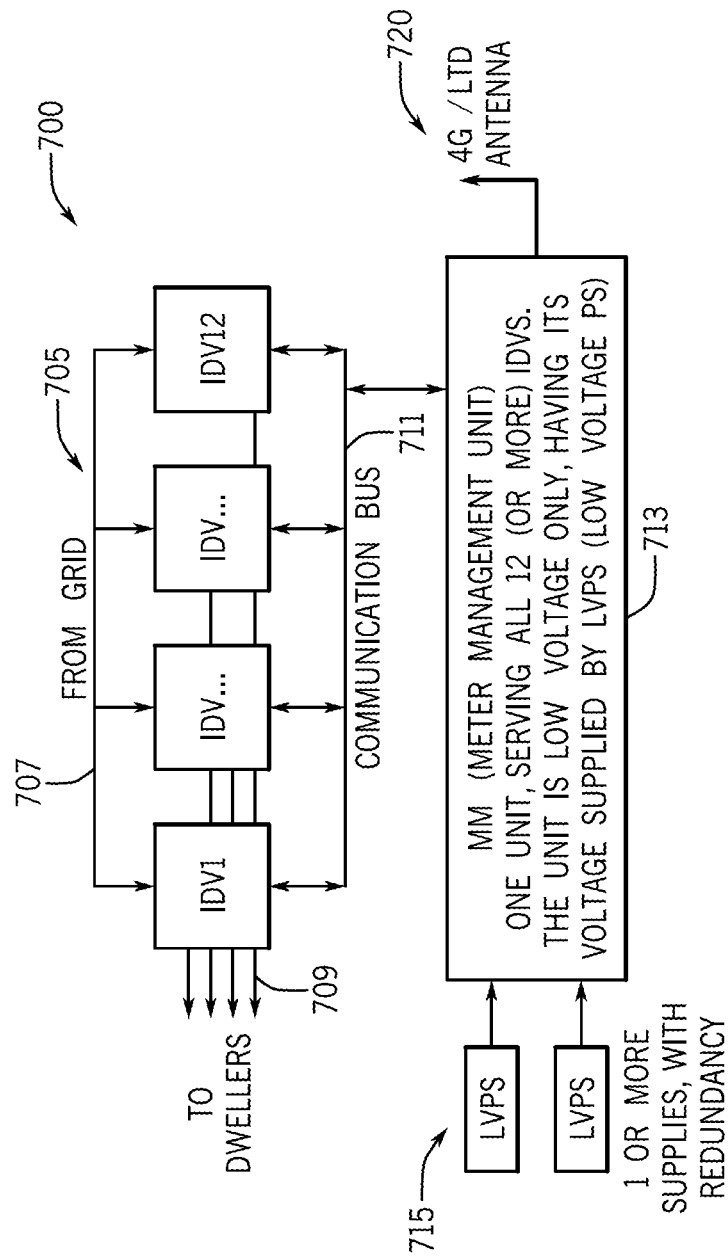
FIG. 13 is a multi-purpose unit system architecture in accordance with some further embodiments of the invention. "LVPS" is low voltage power supply provide power to IDVs.

FIG. 13 is a multi-dwelling unit system architecture 700 in accordance with some further embodiments of the invention, where "LVPS" are low voltage power supplies 715 that can include redundant components. In some embodiments, the two low voltage power supplies 715) can provide power to a metering management unit (MM 713) coupled to a wireless communications antenna or module 720. In some embodiments, one or more IDVs 705 can be coupled in parallel to the electrical grid 707. In some embodiments, the number of IDVs 705 can be up to 12 or more IDVs, and can be configured to provide power 709 to users controlled and/or monitored by the MM 713 by coupling through a communications bus 711. In some embodiments, the MM 713 can comprise a single unit serving a one or more IDVs 705 (e.g., such as all 12 IDV's of the non-limiting embodiments shown). In some embodiments, the MM 713 can include an antenna or module 720 coupled to one or more transceivers of the MM 713 and can be configured to transmit data related to consumable use by at least one consumer. In other embodiments, the MM 713 can transmit data related to a parameter or function of the MM 713 and/or IDVs 705.

Figure 14:
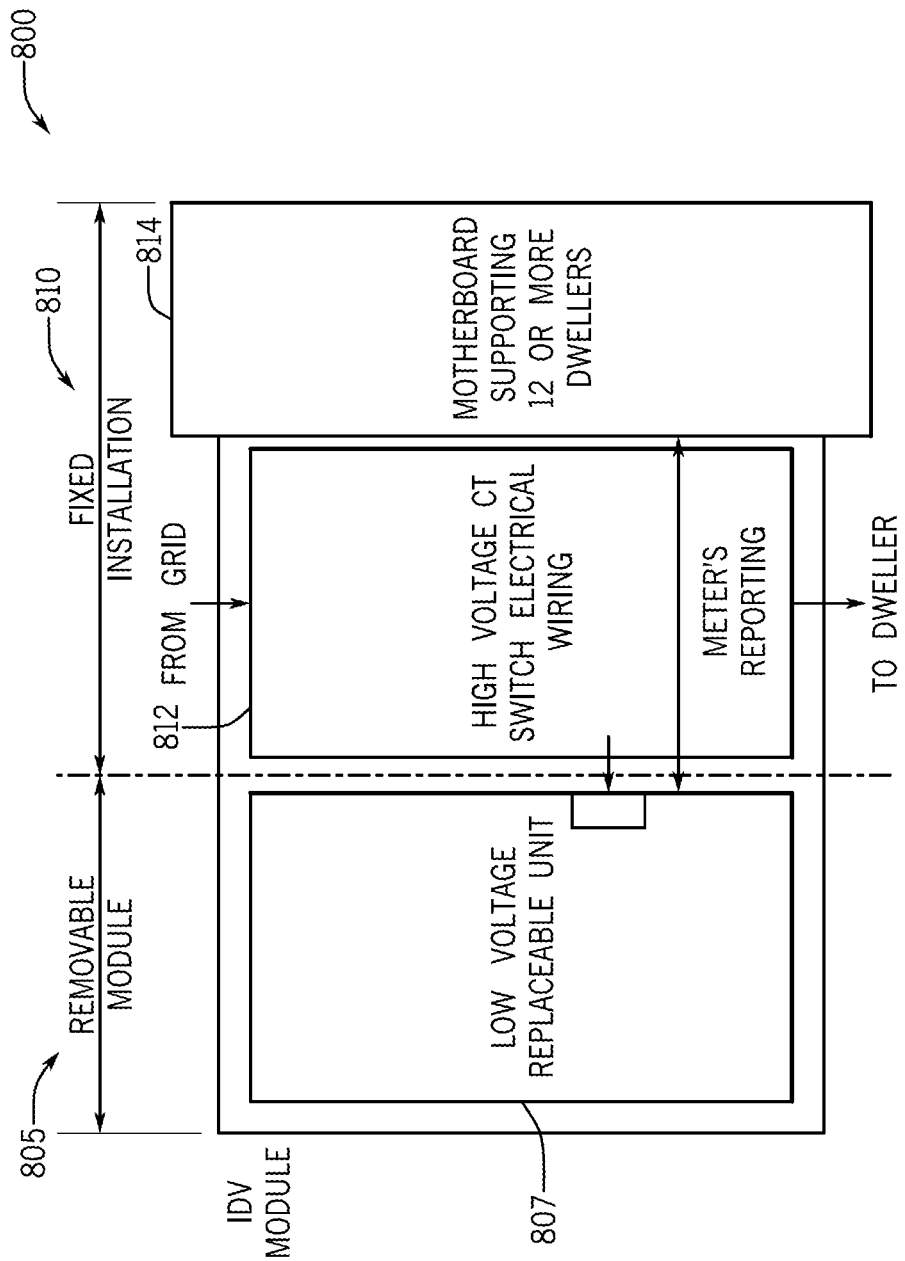
FIG. 14 is an IDV module system in accordance with some further embodiments of the invention.

FIG. 14 is an IDV module system 800 in accordance with some further embodiments of the invention. In some embodiments, the IDV module system 800 can include a base or base module 812. In some embodiments, the base or base module can be configured to be installed or fixed to a surface (e.g., such as a wall of a building). In some embodiments, the base or base module 812 can include or be coupled to a motherboard 814. In some embodiments, the base or base module 812 can include a CT and/or disconnect switch integral to, and/or coupled to a motherboard 814. In some embodiments, the motherboard 814 can be configured to support more than one user or consumer.

Figure 15:
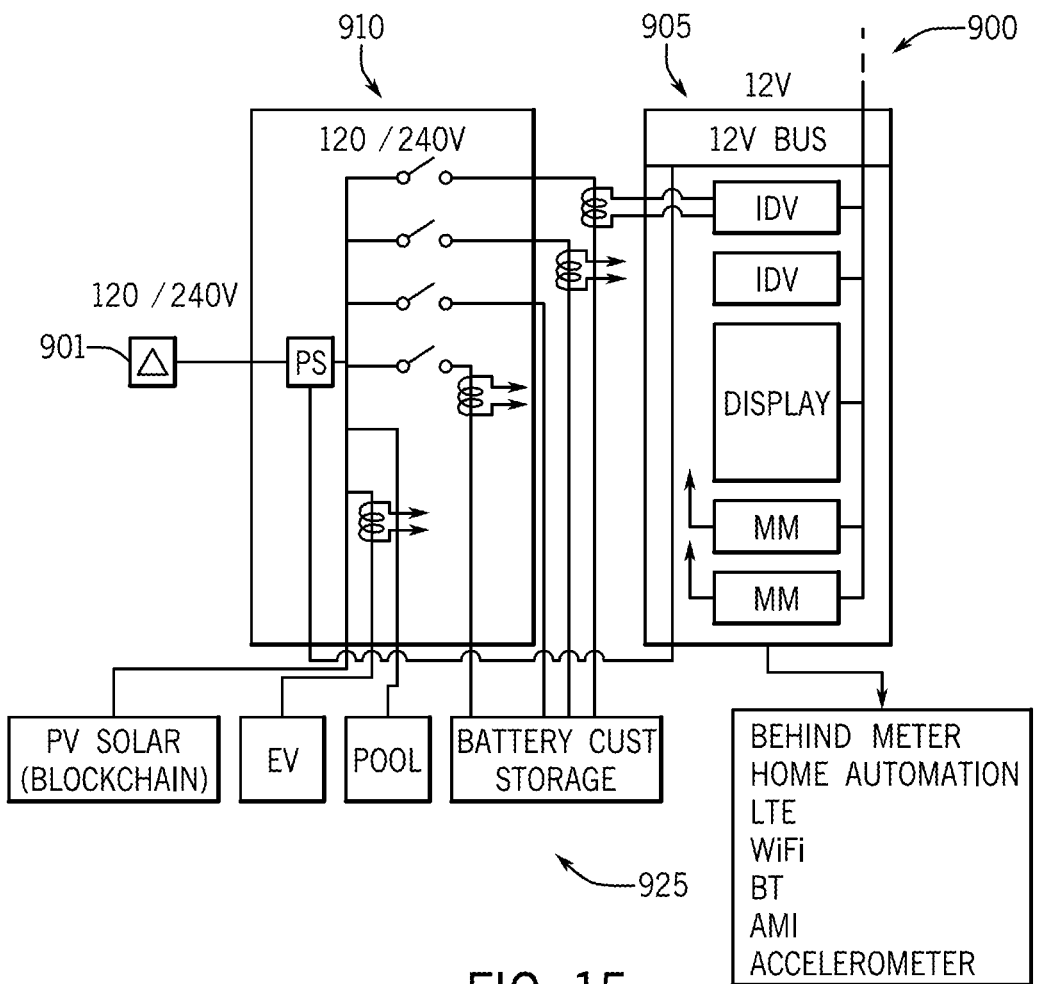
FIG. 15 is a meter system architecture in accordance with some further embodiments of the invention.
Figure 16:
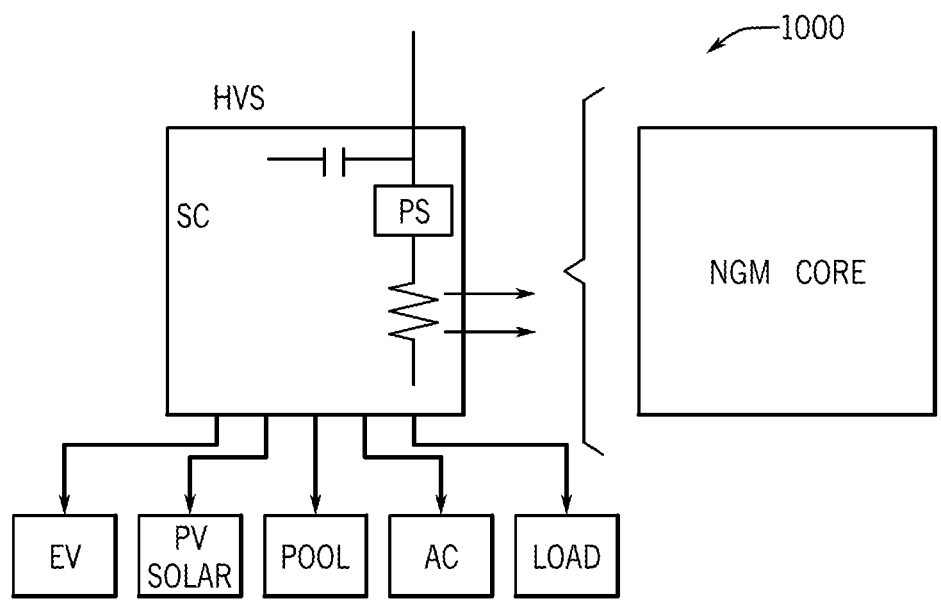
FIG. 16 is a multi-dwelling unit system architecture in accordance with some further embodiments of the invention.

In some embodiments, the IDV module system 800 can include a removable or replaceable ("safe") module 805. In some embodiments, the module 805 can comprise a low voltage replaceable unit 807 that can be coupled to the fixed base module 812 supporting a plurality of customers. In some embodiments, the high-power capable portion of the fixed installation (810) can be removable and can be configured for low or zero maintenance. Further example embodiments of system architectures are shown in FIG. 15, illustrating multi-dwelling unit system architecture 900, and FIG. 16, showing a meter system architecture 1000 comprising an electric grid monitoring metering system using a next generation meter ("NGM"), high voltage supply ("HVS") including a power supply ("PS") with electric vehicle ("EV"), photovoltaic solar (PV solar), pool, AC and load analysis capability. With reference to FIG. 15, from the left to right, embodiments include the power transformer 901 providing electric service to multi-dwelling units building. As illustrated, in some embodiments, this transformer 901 can be coupled to a high-voltage (i.e. 120V/240V) enclosure 910 of the MPM metering system architecture, in which power supply, buses, disconnect switches, wiring, etc. are illustrated. The non-limiting embodiment shows the high-voltage enclosure 910 feeding power to loads 925 (such as photovoltaic solar system, electric vehicle, battery storage, typical lighting loads, etc.) Similarly, the embodiments of the high-voltage enclosure 910 feed dc power to the low voltage (12 Vdc) enclosure 905 where IDVs can be removably mounted, and can measure individual loads fed from the high-voltage enclosure 910. FIG. 16 has a similar concept and illustrates the embodiment 1000 of the EGM that is another new conceptual design of an electric grid monitoring meter.

Figure 17:
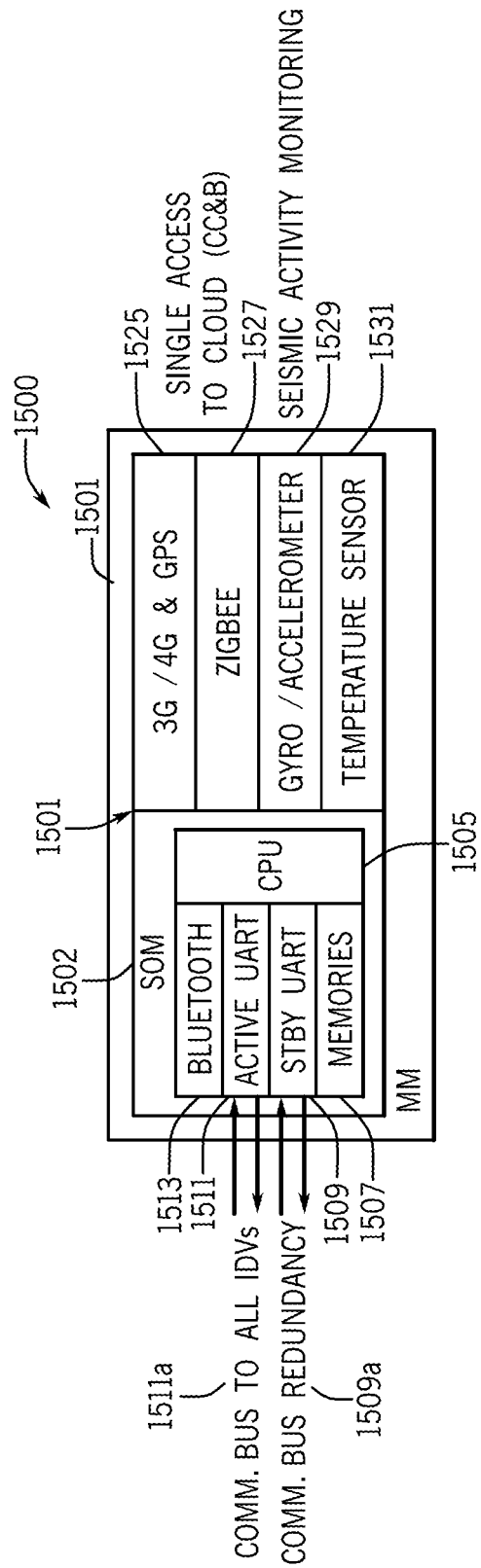
FIG. 17 is a meter manager architecture in accordance with some further embodiments of the invention.

FIG. 17 is a meter manager (MM) architecture 1500 in accordance with some further embodiments of the invention. In some embodiments, any of the systems or architectures described earlier can include the meter manager (MM) architecture 1500 as shown. In some embodiments, the meter manager (MM) architecture 1500 can comprise a meter module 1501 that can include one or more transceivers 3G/4G, GPS (1525), and ZigBee® (1527). In some embodiments, the MM module 1501 can include at least one gyro and/or accelerometer 1529 (or other conventional movement or vibration sensor) that in some embodiments can be used for seismic monitoring. In some embodiments, the MM module 1501 can include at least one temperature sensor 1531. In some embodiments, the MM module 1501 can comprise a system-on-module ("SOM") 1502. Some embodiments include an active (1511) and/or standby (1509) universal asynchronous receiver/transmitter (UART) communicatively coupled to a communication bus 1511*a*. 1509*a*. In some embodiments, the MM module 1501 can include Bluetooth® communication 1513 and a storage media 1507 coupled to a controller and/or processor 1505. In some embodiments, the MM module 1501 can include at least one functionality or assembly for access to a cloud database (e.g., such as the aforementioned CC&B).

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the description and associated figures, and claims.

The invention claimed is:
1. A metering system comprising:
  a base housing configured to be coupled to a supply of a consumable, the base housing including a plurality of meter slots,
  wherein each meter slot of the plurality of meter slots is configured to couple with one of a plurality of removeable meter modules;
  a removeable cover housing configured to removably couple to the base housing;
  a display and/or indicator light positioned on and/or through the removeable cover housing and configured to display a malfunction and/or alert;
  a radio frequency RF module configured to provide sub-metering and communication interconnections between sub-meters and main meters, and interconnectivities with other sub-meters; and
  wherein each one of the plurality of removable meter modules includes at least one meter core and at least one data transfer functionality or assembly;
  wherein the at least one data transfer functionality or assembly is integral to the at least one meter core;
  wherein the at least one data transfer functionality or assembly is configured to enable access to at least one of the removeable meter modules and/or any data from at least one of the removable meter modules;
  wherein the at least one data transfer functionality or assembly is configured to provide access as a data portal to at least one of the removable meter modules;
  wherein the at least one data transfer functionality or assembly is configured to communicate and transfer data to at least one of the plurality removable meter modules; and
  wherein each one of the plurality of removable meter modules are configured to independently meter at least a portion of the consumable consumed by at least one consumer.
2. The metering system of claim 1, further comprising at least one other meter module, the at least one other meter module configured and arranged to independently meter at least a portion of the consumable consumed by the at least one consumer and/or at least one other consumer.
3. The metering system of claim 1,
  wherein the meter module includes at least a portion of a data management system configured and arranged to communicate one or more parameters or data to the removable meter module through the at least one data transfer functionality or assembly.
4. The metering system of claim 3, wherein the data management system includes or is configured to be coupled to a consumer's mobile device or computer to view at least one parameter related to at least one of consumption of the consumable, meter module operation function in real-time, and physical location of the meter module.
5. The metering system of claim 3, wherein the data management system is configured to process and exchange data comprising at least one of consumable usage, meter module operation function in real-time, and physical location of the meter module.
6. The metering system of claim 1, wherein the meter module is a mobile meter module.
7. The metering system of claim 1, wherein the base housing is configured for mounting to a fixed structure in a building.
8. The metering system of claim 1, wherein the removeable cover housing includes at least one of at least one indicator, button, actuator, and interface.
9. The metering system of claim 1, wherein the at least one data transfer functionality comprises at least one of an input/output front end backbone and an RF module.

10. The metering system of claim 1,
wherein at least one of the plurality removable meter modules is a meter management unit; and
wherein the meter management unit is configured to serve as a hub and communicate and connect at least one other of the plurality of removable meter modules to a meter control system.

11. The metering system of claim 10,
wherein the meter management unit is configured to provide control and/or configured to monitor at least one other of the plurality of removable meter modules through a communications bus; and
wherein an antenna or module coupled to one or more transceivers of the meter management unit is configured to transmit telecommunication bits/bytes from the meter management unit or from the at least one other of the plurality of removable meter modules.

12. A metering assembly comprising:
a base configured to be coupled to a supply of a consumable, the base including a plurality of meter slots,
wherein each meter slot of the plurality of meter slots is configured to interface or couple with a removable meter module that includes at least one meter core and at least one data transfer functionality,
wherein the removeable meter module and an associated meter slot is configured to independently meter at least a portion of the consumable consumed by at least one consumer,
wherein metering of the consumable to a consumer from one meter slot is independent of metering of the consumable from at least one other meter slot;
a display and/or indicator light positioned on and/or through the removeable cover housing and configured to display a malfunction and/or alert;
a radio frequency RF module configured to provide sub-metering and communication interconnections between sub-meters and main meters, and interconnectivities with other sub-meters.

13. The metering assembly of claim 12, further comprising one or more indicators lights positioned in the base, the one or more of the indicator lights configured to indicate a function, activity or status of one or more removeable meter modules coupled to the base.

14. The metering assembly of claim 12, further comprising a removeable cover housing configured to reversibly couple to the base.

15. The metering assembly of claim 14, wherein the removeable cover housing includes at least one of at least one indicator, button, actuator, and interface.

16. The metering assembly of claim 12, wherein the base comprises a voltage capability that includes a motherboard configured to support at least one consumer with a voltage that is less than a voltage of the voltage capability.

17. The metering assembly of claim 16, wherein the base is configured to provide the voltage that is less than the voltage of voltage capability using a removeable or replaceable module.

* * * * *